United States Patent
Imai

(10) Patent No.: US 6,518,575 B1
(45) Date of Patent: Feb. 11, 2003

(54) SOLID-STATE RADIATION DETECTORS

(75) Inventor: Shinji Imai, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/538,479

(22) Filed: Mar. 30, 2000

(30) Foreign Application Priority Data

Mar. 30, 1999 (JP) ............................................ 11-089553

(51) Int. Cl.$^7$ ................................................ H01L 25/00
(52) U.S. Cl. ................................ 250/370.09; 250/591
(58) Field of Search ........................ 250/370.08, 370.09, 250/580, 591

(56) References Cited

U.S. PATENT DOCUMENTS

| | | | |
|---|---|---|---|
| 3,069,551 A | 12/1962 | Haine | 250/213 |
| 4,535,468 A | 8/1985 | Kempter | 378/31 |
| 5,166,524 A | 11/1992 | Lee et al. | 250/327.2 |
| 5,331,179 A | 7/1994 | Lee et al. | 250/591 |
| 5,925,890 A * | 7/1999 | Van den Bogaert et al. | 250/580 |
| 6,268,614 B1 * | 7/2001 | Imai | 250/591 |
| 6,310,351 B1 * | 10/2001 | Zur | 250/370.09 |

FOREIGN PATENT DOCUMENTS

| | | |
|---|---|---|
| EP | 574 689 A2 | 12/1993 |
| EP | 0 748 115 A1 | 12/1996 |
| EP | 0 898 421 A2 | 2/1999 |
| JP | 10-232824 | 9/1928 |
| JP | 6-217322 | 8/1994 |
| JP | 9-5906 | 1/1997 |
| JP | 10-271374 | 10/1998 |
| JP | 11-87922 | 3/1999 |
| JP | 11-87923 | 3/1999 |

* cited by examiner

Primary Examiner—Huy Mai
(74) Attorney, Agent, or Firm—Sughrue Mion, PLLC

(57) ABSTRACT

In the charge storing section 19, which is the boundary between a photoconductive layer for recording 12 and a charge transporting layer 13, of a detector 10 with which a first electrode layer 11, a photoconductive layer for recording 12 which exhibits a conductivity when irradiated with recording light L1, a charge transporting layer 13, a photoconductive layer for reading 14, and a stripe electrode 16, are stacked together, and square microplates 18 having roughly the same size as the pixel pitch are discretely disposed just above the elements 16a of the stripe electrode 16 so that each of them corresponds to the pixel. In this way, the pixel locations are fixed at the locations where the microplates 18 are disposed, which makes it easy to compensate for the structure noise, allows the latent image charges stored around the microplates 18 to be sufficiently discharged, and improves the reading efficiency.

16 Claims, 25 Drawing Sheets

X-Y SECTION

X-Z SECTION

F I G. 2A
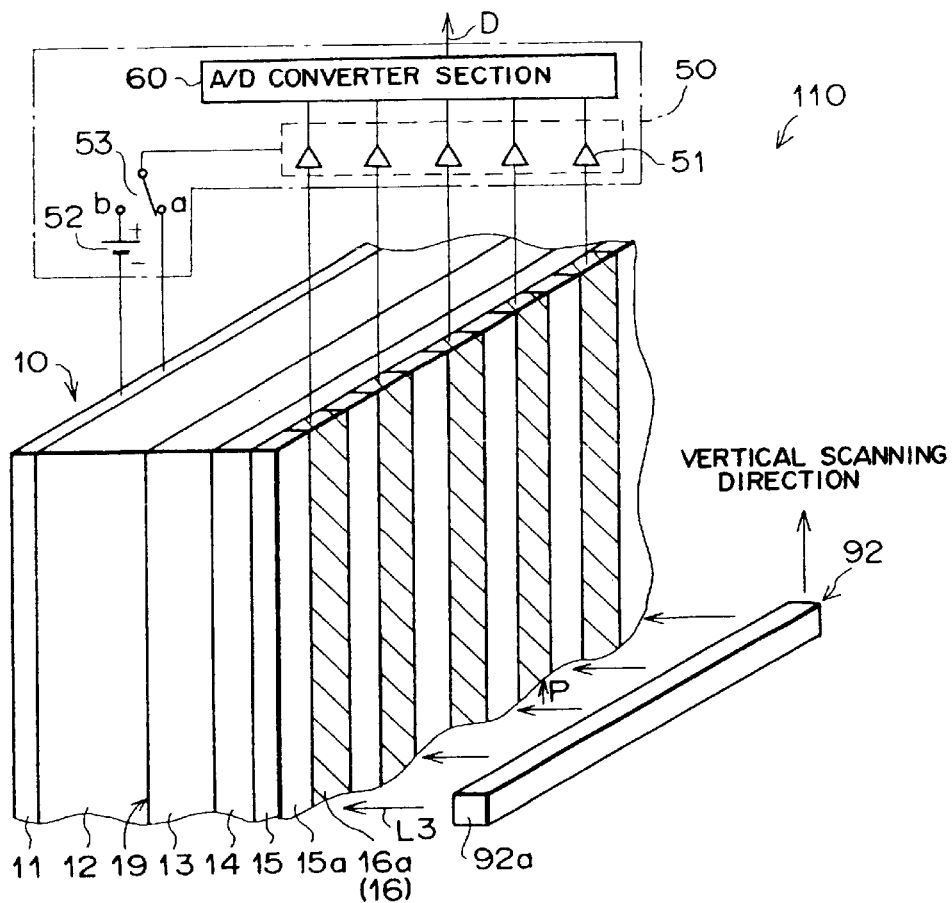
F I G. 2B
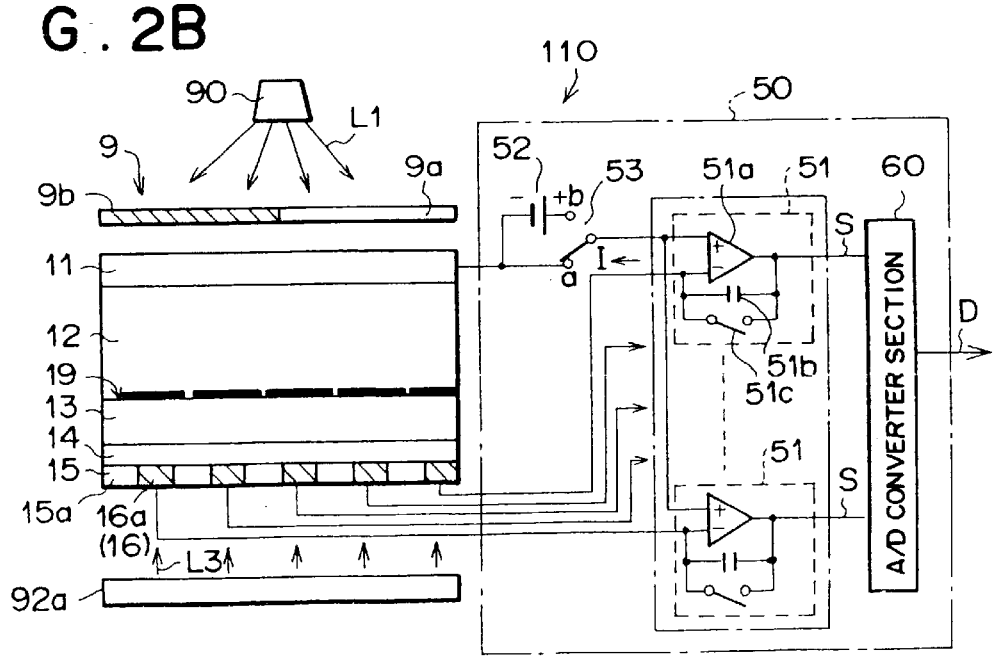

X-Y SECTION

X-Z SECTION

X-Z SECTION

X-Y SECTION

X-Z SECTION

X-Y SECTION

F I G. 14A
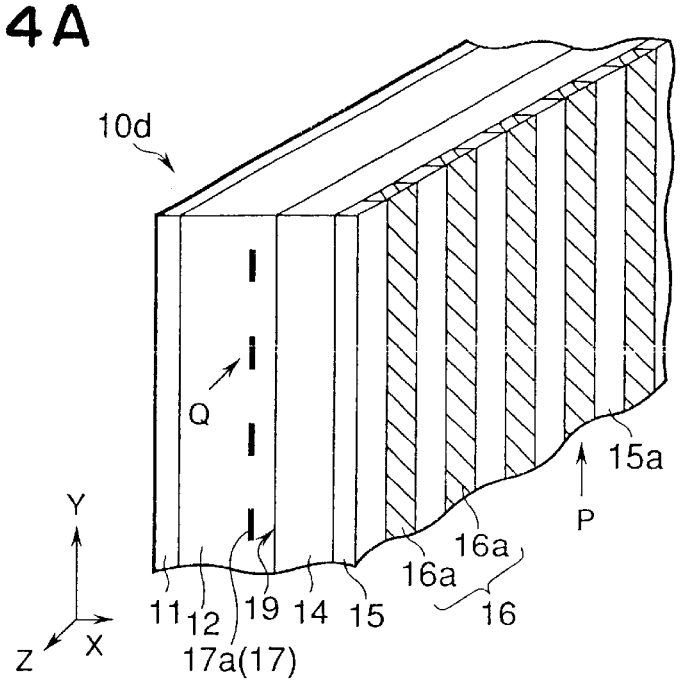
F I G. 14B
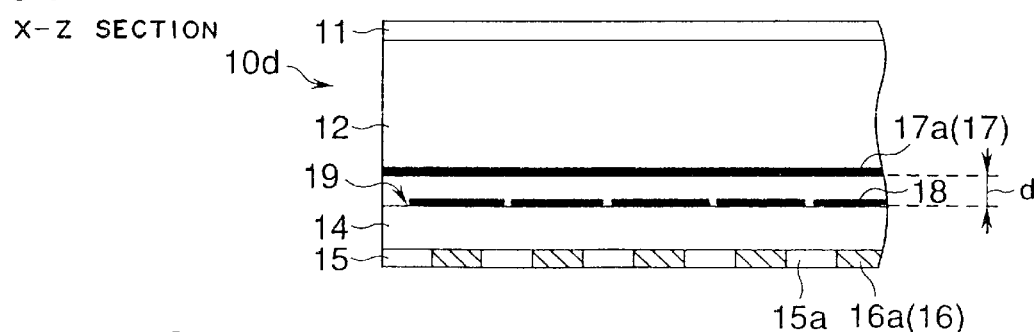
F I G. 14C
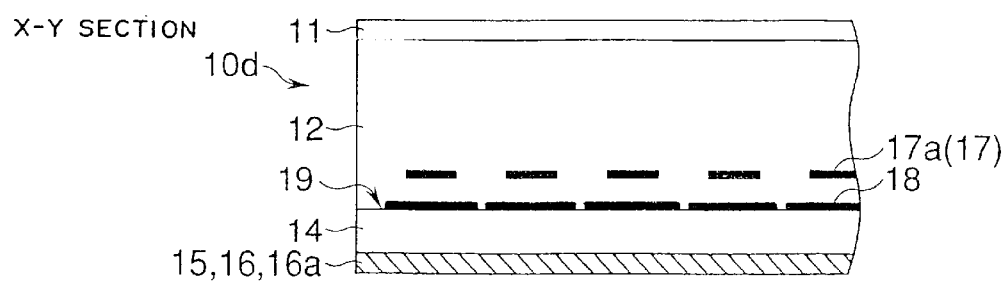

F I G. 15A
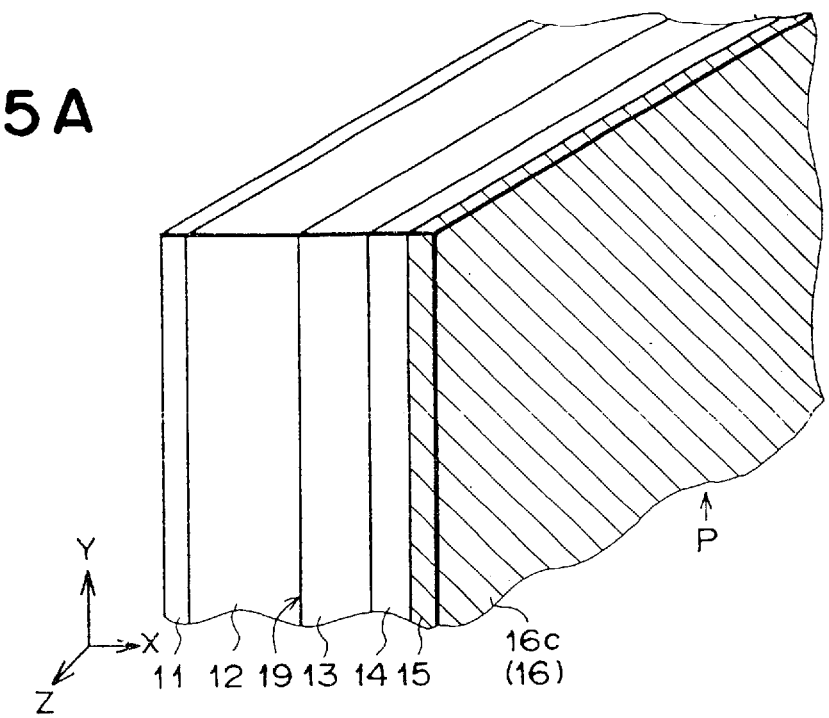
F I G. 15B
X-Y SECTION
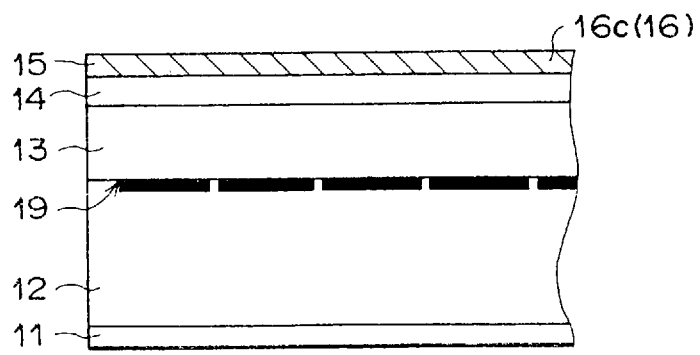
F I G. 15C
X-Z SECTION
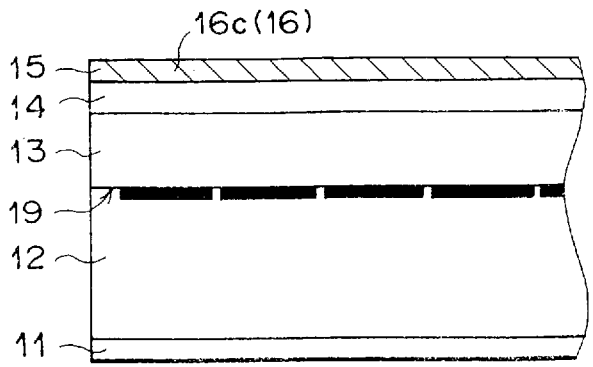

X-Y SECTION

X-Z SECTION

F I G. 23A
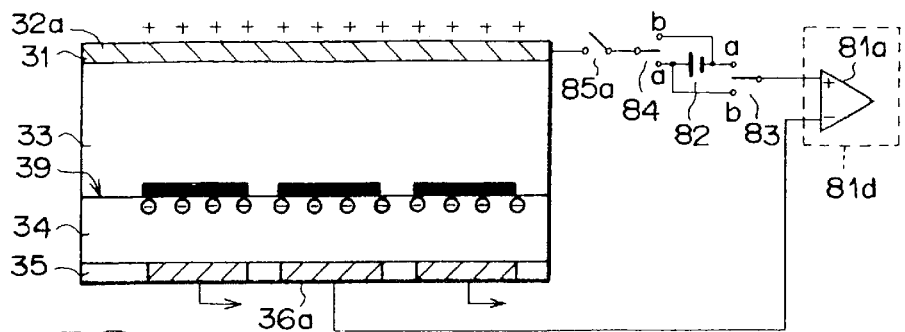
F I G. 23B
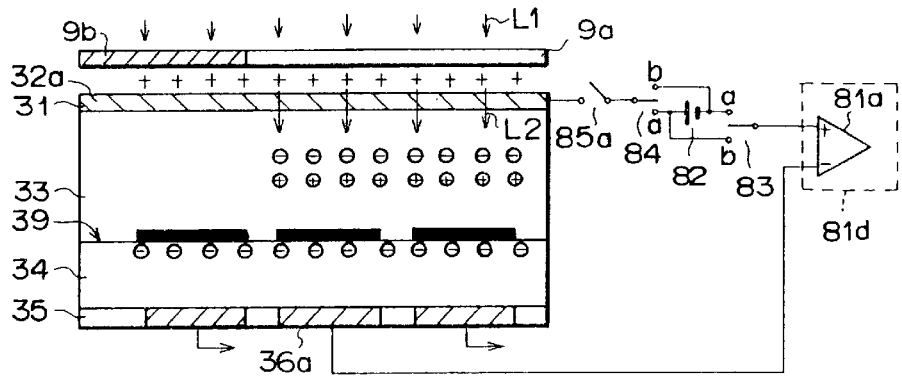
F I G. 23C
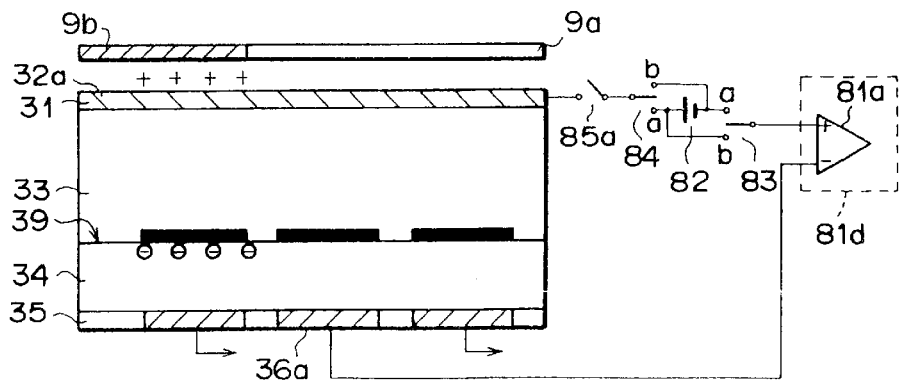

F I G. 25A
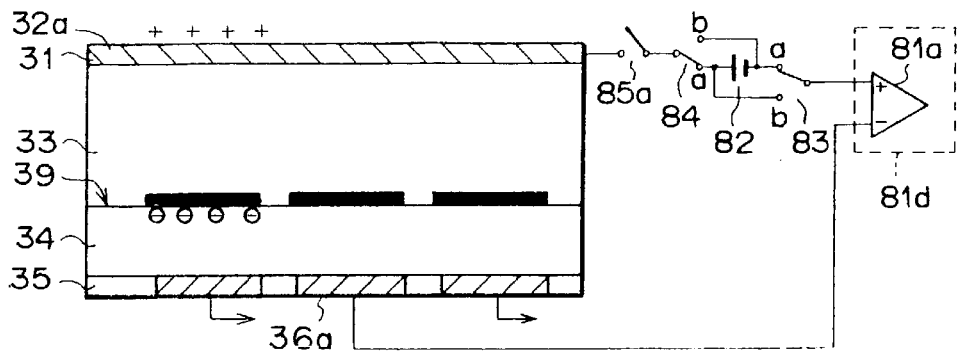
F I G. 25B
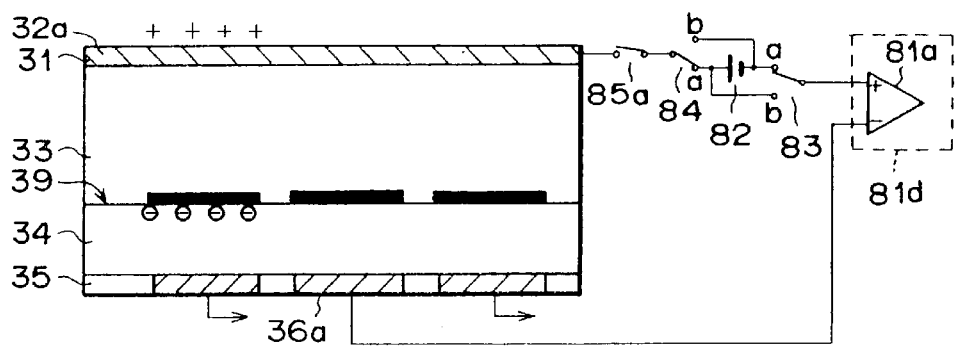
F I G. 25C
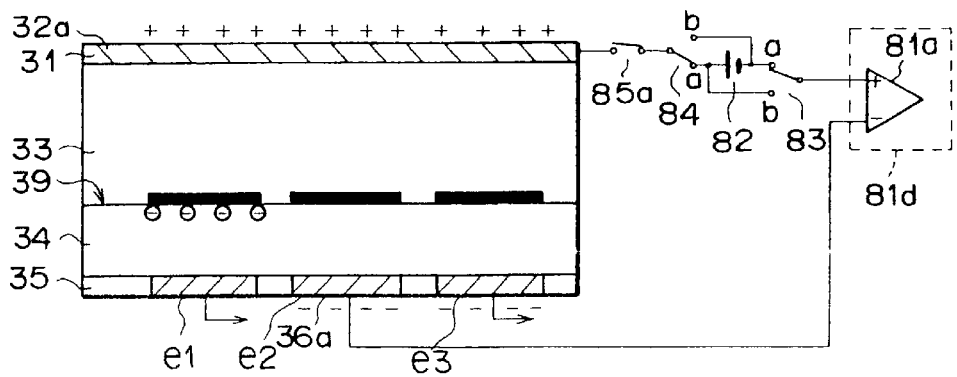

SOLID-STATE RADIATION DETECTORS

BACKGROUND OF THE INVENTION

1. Field of the Invention

The present invention relates to a solid-state radiation detector having a charge storing section which stores the charges of the quantity corresponding to the dose of the projected radiation as latent image charges, and being capable of recording radiation image information as a static latent image in the charge storing section.

2. Description of the Prior Art

To reduce the dose of exposure of the subject and improve the performance of diagnosis in medical radiation photographing, etc., a method has been known up to now which uses, as a photosensitive material, a solid-state radiation detector (a static recorder) with a photoconductor, such as a selenium plate, responding to radiation, such as X-rays; projects the X-rays onto the detector, and stores the charges of the quantity corresponding to the dose of the projected radiation in the charge storing section of the detector as latent image charges for recording of radiation image information as a static latent image (a charge pattern); and uses a laser beam or line light to scan the detector to read out the radiation image information from the detector.

To efficiently store latent image charges in the charge storing section, a detector which is provided with microplates (minute conductive members) or an anisotropic conductive layer has been proposed (for example, U.S. Pat. Nos. 5,166,524, 4,535,468, 3,069,551, European Patent No. 0748115A1, which corresponds to Japanese Unexamined Patent Publication No. 9(1997)-5906, and Japanese Unexamined Patent Publication No. 6(1994)-217322).

The detector as proposed in the above-mentioned U.S. Pat. No. 5,166,524 is a detector with which conductive microplates having a size approximately equal to the smallest pixel size which can be resolved are provided on the surface of the detector, and these microplates form pixels in the fixed locations on the detector. When this detector is used to record a static latent image, and read out it, the electrode of a single plate which is to contact all the microplates is disposed on the surface of the detector; a voltage is applied to this electrode for subjecting it to an electric field; X-rays are projected onto it to store the static latent image in the charge storing section for carrying out the recording; and then the single-plate electrode is removed, and a signal is taken out from the microplates.

The detector is proposed in the above-mentioned U.S. Pat. No. 4,535,468 is a detector comprising a three-layer structure which has an X-ray photoconductive layer, a trap layer, and a photoconductive layer for reading in this order, the charge storing section for storing of charges generated in the X-ray photoconductive layer being formed by the trap layer. When this detector is used to record a static latent image and read it out, a high voltage is applied across the electrodes provided on both sides of the three layer structure, and X-rays are projected to store latent image charges in the charge storing section, and then the electrodes are short-circuited to read out the latent image charges.

The detector as proposed in the above-mentioned U.S. Pat. No. 3,069,551 is a detector with which an anisotropic conductive layer is provided in the detector, and the anisotropic conductive layer forms the charge storing section, and it is almost the same as that proposed in the above-mentioned U.S. Pat. No. 4,535,468.

The detector as proposed in the above-mentioned European Patent No. 0748115A1 is a detector with which a conductive microspot layer in which a number of microspots having a size much smaller than the pixel size are disposed is provided in the detector, and latent image charges are stored in the microspots.

Further, the detector as proposed in the above-mentioned Japanese Unexamined Patent Publication No. 6(1994)-217322 is a detector with which a conductive layer, an X-ray photoconductive layer, a dielectric layer, and an electrode layer comprising a number of microplates corresponding to the pixels are stacked, and a TFT (a thin film transistor) for reading out the charges is connected to each microplate. When the static latent image is to be read out from this detector, the TFTs are scanned and driven to read out the latent image charges stored in the charge storing section to the outside of the detector.

However, with the detectors as proposed in the above-mentioned U.S. Pat. No. 5,166,524 and Japanese Unexamined Patent Publication No. 6 (1994)-217322, pixels can be formed in the fixed locations on the detector by providing microplates as stated above, but with the detector of the U.S. Pat. No. 5,166,524, a single-plate electrode must be disposed on the surface of the detector for carrying out the recording, and thereafter, this single-plate electrode must be removed for taking out a signal, which means that the recording and reading operations are cumbersome, and with the detector of Japanese Unexamined Patent Publication No. 6(1994)-217322, it is necessary to provide TFTs for charge reading in the electrode layer comprising microplates, which presents a problem that the construction of the detector is complicated, resulting in the manufacturing cost for the detector being increased.

On the other hand, the detectors of the U.S. Pat. Nos. 4,535,468, 3,069,551 and European Patent No. 0748115A1 are detectors with which the charge storing section is formed by the trap layer or the like provided in the detector, but, the trap layer or the like is not such that charges are discretely stored for each pixel, presenting problems that pixels cannot be formed in the fixed locations, and the artifact (the structure noise) having a location dependency cannot be properly compensated for.

Also with this U.S. Pat. No. 4,535,468, etc., the electrode is a stripe electrode, and line light is used as reading light, the elements of the stripe electrode being scanned along the longitudinal direction of them with the line light. This means that for the direction of arrangement of the elements, pixels can be formed in the fixed locations, but because the elements are not divided by the pixel size along the longitudinal direction of them, pixels cannot be formed in the fixed locations for the longitudinal direction, resulting in an anisotropy in sharpeness being produced.

In addition, with any of the detectors as disclosed in the above documents, it is difficult to cause the latent image charges to have the same potential for each pixel, the latent image charge around the pixel cannot sufficiently be discharged, and the information around the pixel may not easily be taken out.

The solid-state radiation detector according to the present invention is a solid-state radiation detector having a first electrode layer, a photoconductive layer for recording which exhibits a conductivity when irradiated with radiation which has been projected or light emitted by excitation on the radiation, and a second electrode layer in this order, a charge storing section for storing the charges of the quantity corresponding to the dose of the radiation or the quantity of the light as latent image charges being formed in the vicinity of the surface of the photoconductive layer for recording, and radiation image information being recorded in the charge storing section as a static latent image, in which a conductive member for causing the latent image charges to have the same potential is discretely provided in the charge storing section for each pixel for the static latent image, and is put in the electrically non-connected state.

Here, the phrase "is provided for each pixel" means that preferably one conductive member is provided for each pixel so that the charges around the pixel can be concentrated on the pixel central portion in reading by causing the latent image charges to have the same potential, and does not involve the style in which a number of conductive members are disposed at random for one pixel, and in reading the charges around the pixel cannot be concentrated on the pixel central portion.

The phrase "is discretely provided, and is put in the electrically non-connected state" means that the respective conductive members are disposed in the discrete state from one another, i.e., in the floating state in which they are not connected to one another, and that they are kept open even in the recording process and the reading process. When a plurality of conductive members are provided for one pixel, it is preferable that the members for one pixel be electrically connected to one another.

The size of this conductive member is preferably set at a value approximately equal to the pixel pitch. Alternatively, it may be set at a value smaller than the pixel pitch, say, less than half, and the conductive member may be disposed in the pixel central portion to concentrate the latent image charges on the pixel central portion. The size of this conductive member refers to the diameter for a circular conductive member, and the length of each side for a square conductive member. The shape of the conductive member may be any shape, such as a circle or a square.

The phrase "the vicinity of the surface of the photoconductive layer for recording" refers to the approximate boundary region between the photoconductive layer for recording and the other layer, including the region close to the boundary in the outer layer.

When the electrode of the first and/or second electrode layer of the radiation solid-state detector according to the present invention is a stripe electrode, the conductive member is preferably disposed so that it corresponds to the pixel locations which are defined by the stripe electrode.

The term "stripe electrode" means an electrode comprising a number of linear electrodes which are arranged. The term "linear electrode" means an electrode having a long and slender shape as a whole, and so long as it has a long and slender shape, it may of any shape, such as columnar or prismatic, but it is preferable that the linear electrode be particularly a flat plate electrode. To prevent the latent image forming process and the charge-recoupling process from being affected, such a measure as providing the linear electrode with holes having a desired shape, such as a circle or a square, in correspondence with the pixels, or with an elongated rectangular hole extending along the direction may be taken.

The sentence "the conductive member is disposed so that it corresponds to the pixel locations which are defined by the stripe electrode" means that the conductive member is disposed so that it corresponds to the pixel locations which are defined by the way in which the linear electrodes of the stripe electrode are arranged. For example, when the electrode of either of the electrode layers is a strip electrode, the conductive member is disposed roughly just above or just under the linear electrodes. Further, when the electrodes of both electrode layers are stripe electrodes, and the linear electrodes of both electrode layers are disposed so that they are opposed to each other, the conductive member is disposed at locations where it is sandwiched between the corresponding two linear electrodes. Further, when the electrodes of both electrode layers are stripe electrodes, and the two linear electrodes are disposed so that they intersect each other, the conductive member is disposed at locations where the linear electrodes intersect. Further, when a new stripe electrode is to be provided in a layer other than the two electrode layers, for example, the photoconductive layer for recording, the conductive member is disposed at the sandwiched locations or the intersecting locations with respect to the new stripe electrode.

The solid-state radiation detector according to the present invention may have a charge transporting layer which acts roughly as an insulator for the latent image charges, and roughly as a conductor for charges opposite in polarity to the latent image charges, provided between the photoconductive layer for recording and the photoconductive layer for reading, with the charge transporting layer forming the charge storing section. In this case, it is preferable that the conductive member be provided at the boundary between the photoconductive layer for recording and the charge storing section.

The solid-state radiation detector according to the present invention may have a trap layer for catching the latent image charges, the trap layer forming the charge storing section. In this case, it is preferable that the conductive member be provided at the boundary between the photoconductive layer for recording and the trap layer.

The detector to which the conductive member according to the present invention is applicable may be of any type, provided that it is a detector which has a photoconductive layer for recording sandwiched between electrode layers, and may have a layer other than the photoconductive layer for recording. As the method for taking out the latent image charges to the outside of the detector for reading out the static latent image, the electric reading mode with which the charges are taken out according to the switch selection, and the light reading mode with which the charges are taken out by projecting an electromagnetic wave for reading onto the detector are available, and the detector to which the present invention is applicable may adopt either of these modes.

In carrying out the recording and reading of a radiation image with the use of the detector according to the present invention, the conventional recording method and device using a detector which is not provided with the conductive member according to the present invention can be utilized as they are, with no change required. When the present invention is applied to a detector of the light reading mode, it is preferable that the electromagnetic wave for reading be projected at least to the locations where the conductive member is provided.

With the radiation solid-state detector according to the present invention, the conductive member is discretely provided for each pixel in the charge storing section in the detector, which means that the latent image charges for each pixel stored on the conductive member can be caused to have the same potential, allowing the reading efficiency to be increased to a level higher than that obtained when the conductive member is not provided. This is because the latent image charges are held at the same potential in the range of the conductive member, so that the latent image charges around the pixel which are generally difficult to read out can be moved to the central portion of the conductive member, i.e., the pixel central portion, as the reading progresses, so long as they are in the range of the conductive member, which means that the latent image charges can be sufficiently discharged.

In addition, the pixel can be formed in the fixed location where the conductive member is disposed, which allows the structure noise to be compensated for.

Further, if the size of the conductive member is set at a value smaller than the pixel pitch, and disposed in the central portion of the pixel, the shape of the electric field formed in reading can be such that the electric field is attracted toward the conductive member, and so the latent image charges can be stored, being concentrated on the pixel central portion, which means the sharpeness of the image can be improved.

If this conductive member is provided, the latent image charges can be stored with no charge transporting layer or trap layer, and so device formation can be performed more easily.

When the detector having a charge transporting layer or trap layer is provided with the conductive member, the charge storing effect by such layer can also be utilized. In other words, if the size of the conductive member is set at a value smaller than the pixel pitch, and such a layer is not provided, a problem arises where the charges which have not been caught by the conductive member cannot be stored as latent images, resulting in the quantity of the stored charges being decreased, although they contribute to the improvement in sharpness. Contrarily, when such a layer is provided, the charges are caused to be stored as latent image charges, so that the sharpness can be improved without the quantity of stored charges being reduced.

Because the recording and reading can be carried out with the conductive member being kept in the floating state, there is no need to provide TFTs for reading out the charges on the conductive member, which makes it possible to obtain a simple construction detector with which the layers are stacked together, resulting in the manufacturing cost being lowered.

In addition, a device which is the same as the conventional device, which is not provided with the conductive member, can be utilized, meaning that, applying the present invention will not complicate the recording and reading methods and the device.

SUMMARY OF THE INVENTION

The present invention is intended to offer solid-state radiation detectors having pixels that can be formed at fixed locations on the detector, and the latent image charges around the pixel can be sufficiently discharged.

The present invention is also intended to offer detectors with which the sharpeness of the image detected can be improved.

Further, the present invention is intended to offer detectors with which no TFTs are used, resulting in the construction of the detector being simplified, and therefore an increase in manufacturing cost being avoided, and the recording and reading can be carried out in convenient ways.

BRIEF DESCRIPTION OF THE DRAWINGS

FIG. 2A and FIG. 2B are schematic diagrams for a record-reading device using the solid-state radiation detector according to the first embodiment, FIG. 5A and FIG. 5B being for a conventional detector, which is provided with no microplates, and FIG. 5C and FIG. 5D being for a detector according to the present invention, which is provided with microplates, FIG. 14A is a perspective side view of a solid-state radiation detector of a fifth embodiment according to the present invention; FIG. 14B is an X-Z sectional drawing of the portion shown by the arrow-Q; and FIG. 14C is an X-Y sectional drawing of the portion shown by the arrow-P, FIG. 15A is a perspective side view of a solid-state radiation detector of a sixth embodiment according to the present invention; FIG. 15B is an X-Y sectional drawing of the portion shown by the arrow-P; and FIG. 15C is an X-Z sectional drawing of the portion shown by the arrow-Q, FIG. 23A to FIG. 23C show an electric charge model illustrating the latent image recording process in the case where the solid-state radiation detector according to the seventh embodiment is used, FIG. 25A to FIG. 25C show an electric charge model illustrating the latent image reading process on the charging current detection in the case where the solid-state radiation detector according to the seventh embodiment is used.

DESCRIPTION OF THE PREFERRED EMBODIMENTS

Hereinbelow, embodiments of the present invention will be described with reference to the drawings.

Figure 1A:
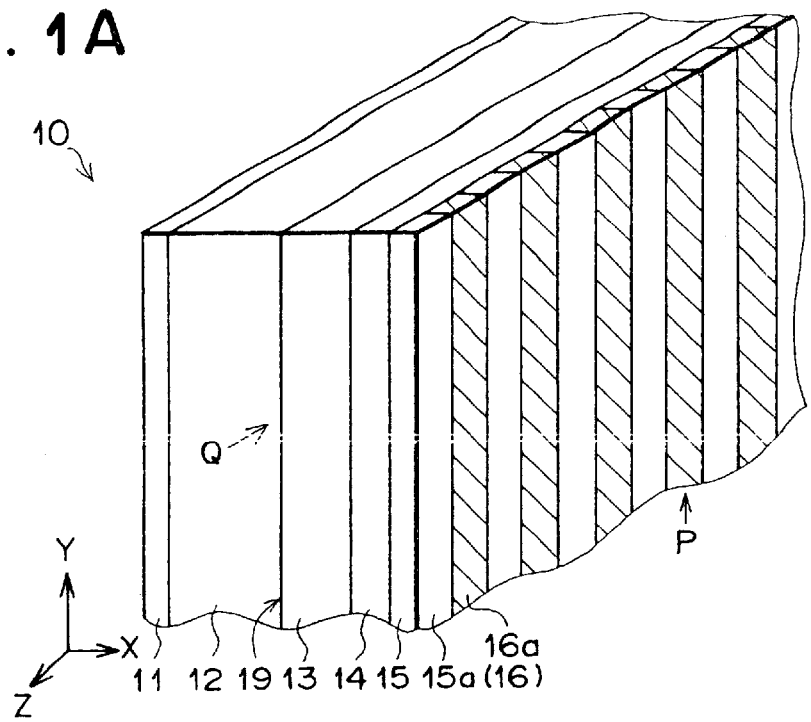
FIG. 1A is a perspective side view of a radiation solid-state detector according to a first embodiment of the present invention.
Figure 1B:
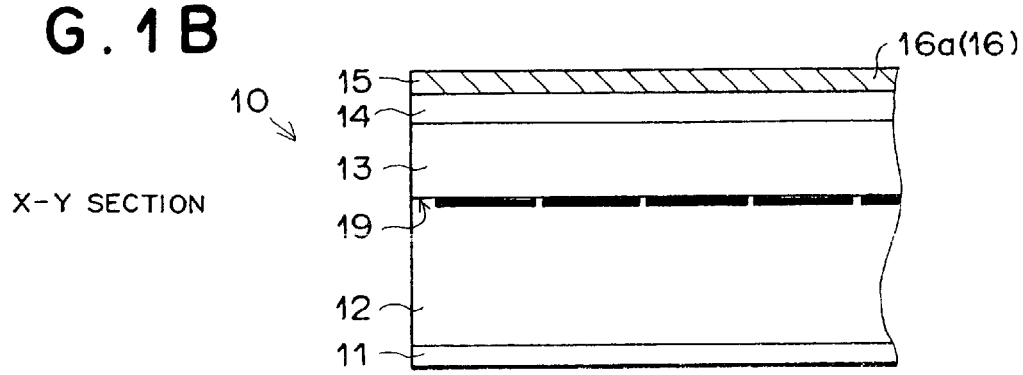
FIG. 1B is an X-Y sectional drawing of the portion shown by the arrow-P.
Figure 1C:
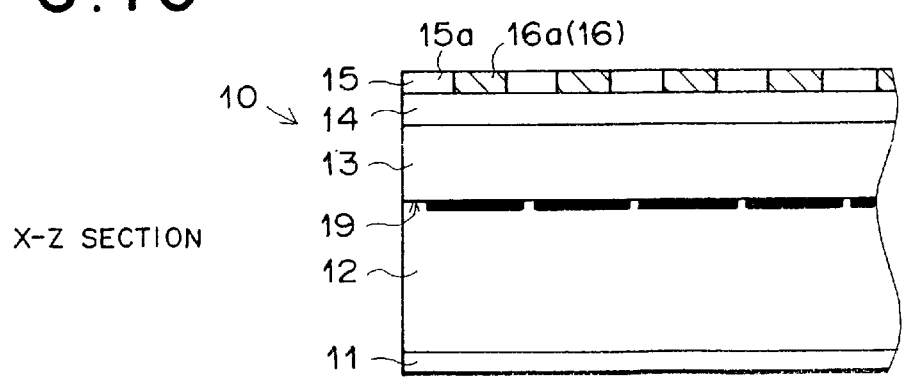
FIG. 1C is an X-Z sectional drawing of the portion shown by the arrow-Q.

FIG. 1A, FIG. 1B, and FIG. 1C are drawings showing the schematic configuration of the solid-state radiation detector according to a first embodiment of the present invention; FIG. 1A being a perspective side view of a radiation solid-state detector; FIG. 1B being an X-Y sectional drawing of the portion shown by the arrow-P; and FIG. 1C being an X-Z sectional drawing of the portion shown by the arrow-Q. FIG. 2A and FIG. 2B are schematic diagrams for the principal section of a radiation image record-reading device which uses the solid-state radiation detector according to the first embodiment to record and read out radiation image information.

This solid-state radiation detector 10 records a static latent image as radiation image information, and when scanned with the electromagnetic wave for reading (hereafter called the reading light) L3, outputs the quantity of the latent image charges stored in the charge storing section 19 of the detector 10, i.e., the current corresponding to the static latent image to the outside. In other words, as shown in FIG. 1, a first electrode layer 11 having a permeability to the radiation for recording, L2, such as X-rays (hereafter called the recording light); a photoconductive layer for recording, 12, which exhibits a conductivity when irradiated with the recording light L2; a charge transporting layer 13 which acts almost as an insulator for the latent image charges, while acting roughly as a conductor for transported charges having a polarity opposite to that of the latent image charges; a photoconductive layer for reading, 14, which exhibits a conductivity when irradiated with the electromagnetic wave for reading, L3; and a second electrode layer 15 having a permeability to the reading light L3, are stacked together in this order (more specifically, refer to the static recorder as proposed by the present applicant in Japanese Patent Application No. 10 (1998)-232824). The charge storing section 19 is formed roughly at the boundary between the photoconductive layer for recording, 12, and the charge transporting layer 13, and the negative charges of the pairs of charges, positive and negative, generated in the photoconductive layer for recording, 12, in recording are stored as the latent charges in the charge storing section 19. The sum of the thickness of the charge transporting layer 13 and that of the photoconductive layer for reading, 14, is set at a value smaller than the thickness of the photoconductive layer for recording, 12.

The electrode of the second electrode layer 15 is formed as a stripe electrode 16 with which a number of elements (linear electrodes) 16a are arranged in the form of stripes. In an area 15a between elements 16a, a high-polymer material, such as polyethylene in which some quantity of carbon black or other pigment is dispersed in filled, and the area 15a has a shading property with respect to the reading light L3.

At the boundary between the photoconductive layer for recording, 12, and the charge transporting layer 13, which is the charge storing section 19, a number of square microplates 18 are disposed discretely just above the elements 16a of the stripe electrode 16, each being spaced apart from the adjacent microplates 18, so that the respective microplates 18 correspond to the pixel. The length of the side of each microplate 18 is specified to be a dimension approximately equal to the pixel pitch, and the microplates 18 are disposed at the pixel pitch for the longitudinal direction of the element 16a. The microplates 18 are disposed in the discrete state, i.e., the floating state in which they are not connected to one another.

The microplates 18 can be produced from an extremely thin film of a single metal, such as gold, silver, aluminum, copper, chromium, titanium, and platinum, or an alloy, such as indium oxide, which is deposited on the dielectric layer by using vacuum vapor deposition or chemical deposition, for example. The microplates 18 can be deposited as a continuous layer, and the continuous layer is then etched to form a plurality of individual discrete microplates having a dimension approximately equal to the smallest pixel pitch which can be resolved. Such discrete microplates can be produced by using laser ablation, photoetching, or other light microfabrication technology.

As shown in FIG. 2A and FIG. 2B, a radiation image record-reading device 110 comprises the detector 10; a reading section 50 as image data acquisition means for acquiring image data carrying radiation image information from the detector 10 in which the radiation image information has been recorded as a static latent image; a radiation source 90 which emits radiation, such as X-rays, toward the subject; and reading light projection means 92 having a reading light source 92a which emits linear reading light L3.

The reading light projection means 92 linearly projects the almost uniform reading light L3 on the elements 16a of the stripe electrode 16 roughly at right angles to them, scanning the elements 16a along the longitudinal direction of them from on end to the other. As the reading light source 92a which emits linear reading light L3, an LED or the like having a long and slender shape can be used, and the reading light projection means 92 may be configured so that this LED is moved relatively to the detector 10 for scanning with the reading light L3. A planar light source as the reading light source, such as a liquid crystal and an organic EL, may be integrated with the detector 10 for scanning by electrically moving the linear reading light (more specifically, refer to refer to Japanese Patent Application No. 10 (1998)-271374). By using beam light rather than the linear reading light, the elements 16a may be sequentially scanned in the horizontal scanning direction.

The reading light L3 for reading may be continuous light generated continually or pulsed light generated in the form of a pulse, but the pulsed light permits a higher current to be detected, allowing a pixel having a small quantity of latent image charges to be detected as a sufficiently high current, which can substantially improve the S/N ratio, which is advantageous. However, when the pulsed light is to be used, the pulsed light must be projected to the locations corresponding to the locations in the photoconductive layer for reading, 14, where the microplates are disposed.

As shown in FIG. 2B, the reading section 50 has a number of current detection amplifiers 51 each comprising an operational amplifier 51a, an integrating capacitor 51b, and a switch 51c. The elements 16a of the strip electrode 16 are each connected to the inverting input terminal (−) of the respective operational amplifiers 51a. The reading section 50 is provided with an A/D converter section 60, and the image signal S, which is an output from the respective amplifiers 51, is inputted to the A/D converter section 60. The reading section 50 is also provided with a power supply 52 and a switch 53 for applying a specified voltage across both electrode layers 11 and 15 of the detector 10.

The electrode of the electrode layer 11 is connected to the one input "a" of the switch 53 and the negative electrode of the power supply 52, and the positive electrode of the power supply 52 is connected to the other input "b" of the switch 53. The output of the switch 53 is commonly connected to the non-inverting input terminal (−) of each operational amplifier 51a. The configuration of the current detection amplifier 51 is not limited to that in this example, and a variety of well known configurations may be used. Depending upon the configuration of the current detection amplifier 51, the style of connection to the power supply 52 and the switch 53, and the element 16a may differ from that of this embodiment.

Hereinbelow, the method for recording radiation image information as a static latent image in the detector 10 and reading out the recorded static latent image from this detector 10 for acquiring image data carrying the radiation image information with the radiation image record-reading device 110 configured as above will be briefly described (more specifically, refer to Japanese Patent Application No. 10 (1998)-232824 by the present applicant).

Figure 3A:
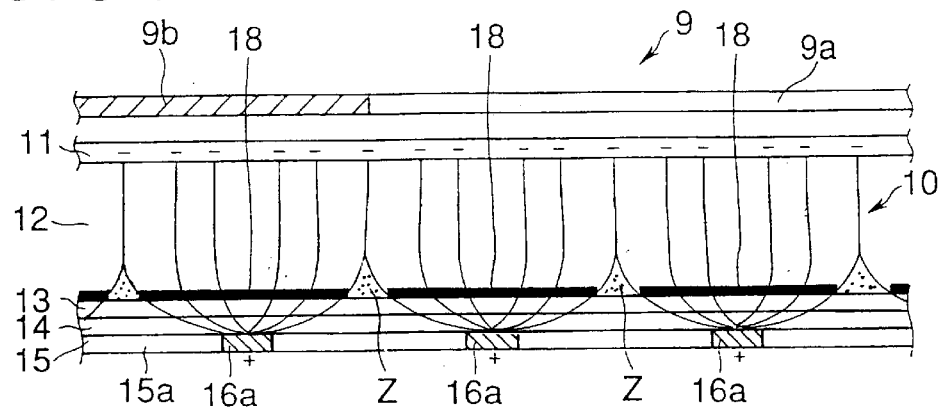
FIG. 3A to FIG. 3C are drawings illustrating the method for recording a static latent image in the above-stated solid-state radiation detector.
Figure 3B:
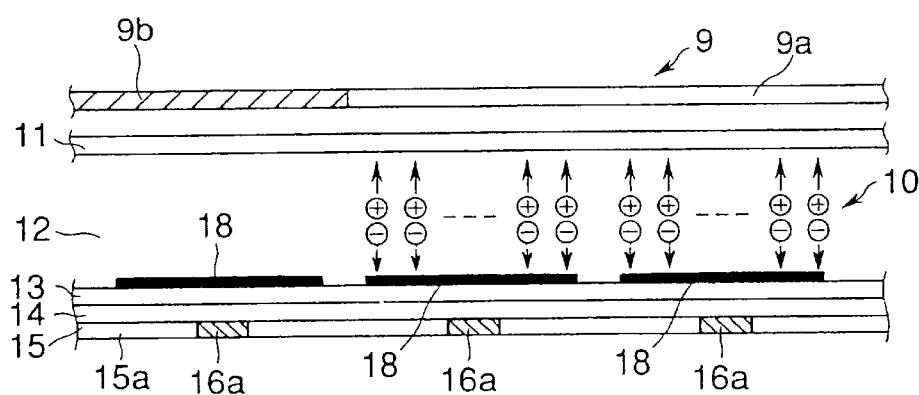
Figure 3C:
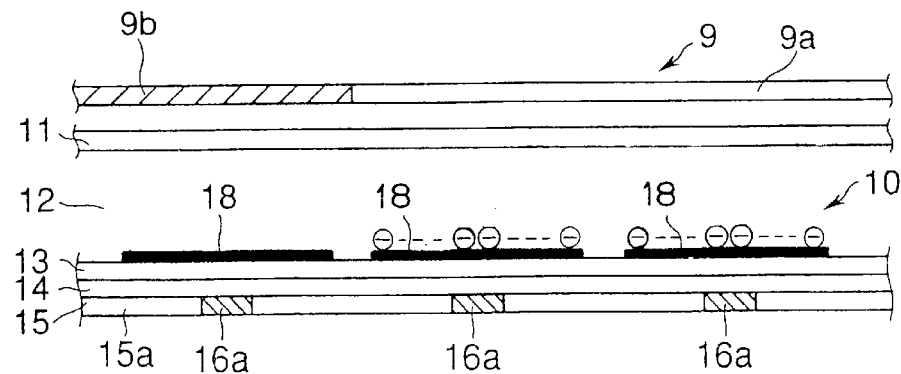

First, the process of recording a static latent image will be described with reference to the electric charge model as shown in FIG. 3A to FIG. 3C. The negative charges (−) and the positive charges (+) generated in the photoconductive layer 12 by the recording light L2 are expressed by encircling the signs "−" and "+" on the drawing.

When, with the device 110 configured as above, a static latent image is recorded in the detector 10, the switch 53 is first turned to the "b" terminal to apply the DC voltage across the electrode of the electrode layer 11 and the stripe electrode 16 to electrify both. As a result, a nearly U-shaped electric field is formed across the electrode of the electrode layer 11 and the strip electrode 16, and in most of the photoconductive layer for recording, 12, a roughly parallel electric field is provided, but at the boundary between the photoconductive layer for recording, 12, and the charge transporting layer 13, i.e., in the charge storing section 19, there occur portions where no electric field is applied.

Next, the radiation is projected onto the subject 9, and the recording light L2 carrying the radiation image information for the subject 9 which has penetrated through the permeating portion 9a of the subject 9, is projected onto the detector 10. Then, pairs of charges, positive and negative, are generated in the photoconductive layer for recording, 12, in the detector 10, and the negative charges of the pairs are transferred to the charge storing section 19 along the above-stated electric field (FIG. 3B).

In the charge storing section 19, microplates 18 are provided, and the negative charges which have been transferred in the photoconductive layer for recording, 12, are caught and stopped by the microplates 18, being stored as latent image charges on the microplates 18 in this charge storing section 19 (FIG. 3C).

On the other hand, the positive charges generated in the photoconductive layer for recording, 12, are transferred at high speed to the electrode layer 11, and charge-recoupled with the negative charges injected from the power supply 52 at the boundary between the electrode layer 11 and the photoconductive layer for recording, 12, thus being cancelled. The recording light L2 will not permeate the shading portion 9b of the subject 9, and therefore no change will be caused in the area of the detector 10 under the shading portion 9b (FIG. 3B) and FIG. 3C).

The quantity of the stored latent image charges (negative) is roughly in proportion to the dose of the radiation which has been caused to penetrate through the subject 9 and projected onto the detector 10, which means that these latent image charges carry the static latent image, and the static latent image is recorded in the detector 10. Because the latent image charges are stored on the microplates 19, a pixel can be formed at the locations where the latent image charges are to be stored, i.e., the established locations for both the horizontal scanning and the vertical scanning.

Figure 4A:
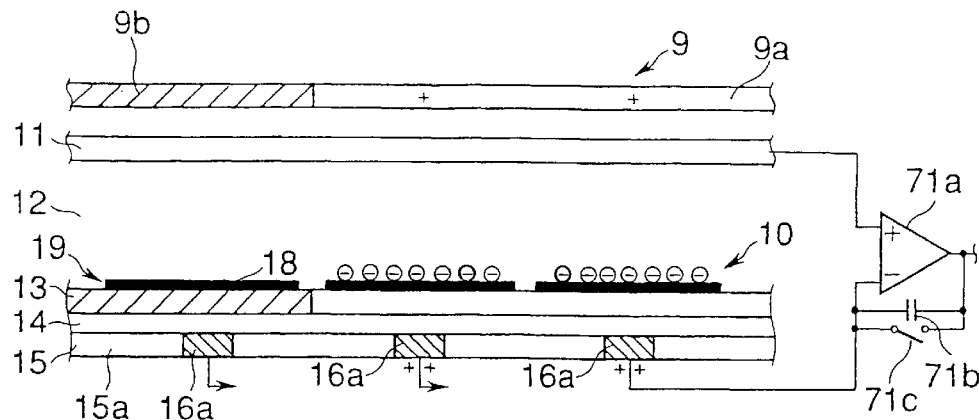
FIG. 4A to FIG. 4C are drawings illustrating the method for reading out a static latent image recorded in the above-stated solid-state radiation detector.
Figure 4B:
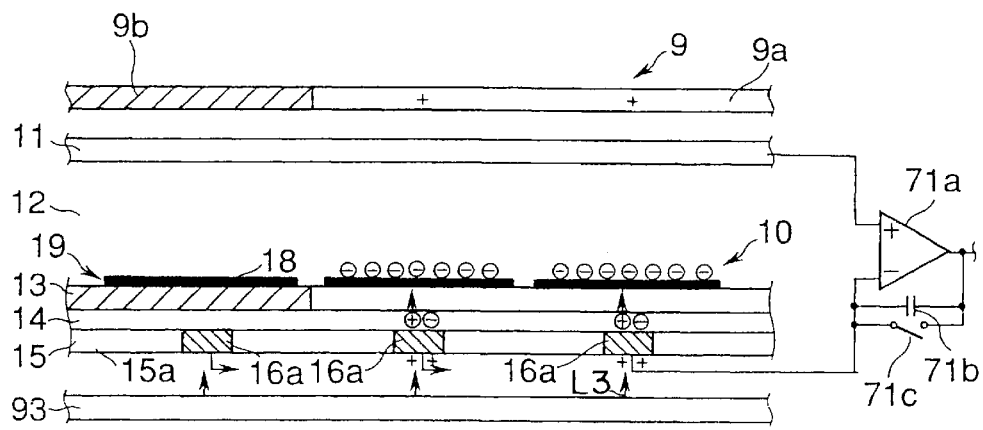
Figure 4C:
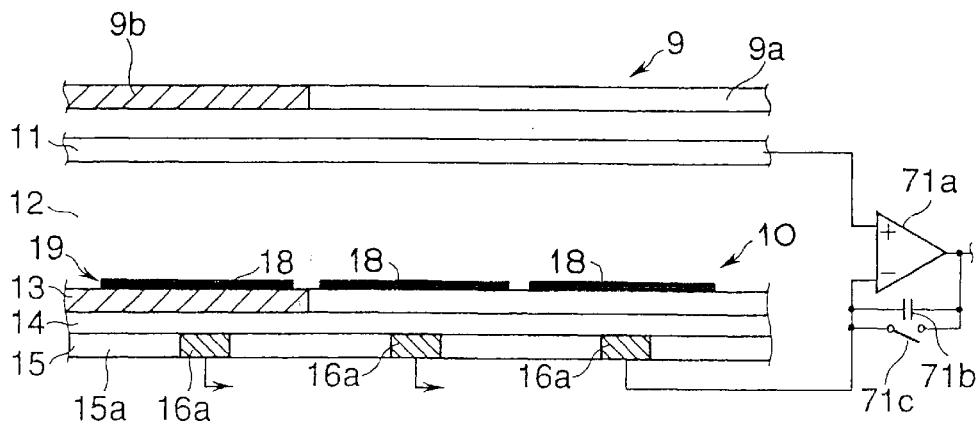

Next, the process of reading out a static latent image will be described with reference to the electric charge model as shown in FIG. 4A to FIG. 4C. As is the case with the recording process, the negative charges (−) and the positive charges (+) generated in the photoconductive layer for reading, 14, by the reading light L3 are expressed by encircling the signs "−" and "+" on the drawing.

In reading out the static latent image from the detector 10, the switch 53 is first turned to the "a" terminal to be connected to the electrode of the electrode layer 11 for emitting the linear reading light L3, and carrying out the optical scanning along the longitudinal direction of the elements 16a of the stripe electrode 16 (FIG. 4A). When the reading light L3 is projected in a pulsating manner to reduce the detrimental effect of the offset current, such as the dark current, the scanning is synchronized so that the reading light L3 is projected where the microplates 18 are provided.

This scanning with the reading light L3 generates pairs of charges, positive and negative, at the locations in the photoconductive layer for reading, 14, which correspond to the scanning positions and where the reading light L3 is projected (FIG. 4B). The positive charges are then rapidly transferred in the charge transporting layer 13, being attracted by the latent image charges stored in the charge storing section 19, and are cancelled due to the charge-recoupling with the latent image charges in the charge storing section 19. On the other hand, the negative charges generated in the photoconductive layer for reading, 14, are cancelled by charge-recoupling with the positive charges on the electrode of the electrode layer 11 and the stripe electrode 16, being cancelled (FIG. 4C). In this charge-recoupling, a current flows through the detector 10 with the transfer of the charges. The current detection amplifiers 51 concurrently detect the current flowing through the imaginary short circuit in the operational amplifier 51*a* for the respective elements 16*a*. The quantity of current flowing through the detector 10 in this reading corresponds to the quantity of the latent image charges, i.e., the static latent image, and so the voltage at the output terminal of the current detection amplifier 51 varies in correspondence with the quantity of the current, and by acquiring this voltage change as an image signal S carrying the static latent image, the static latent image can be read out.

The image signal S outputted from the respective current detection amplifiers 51 is inputted to the A/D converter section 60. The digitized image data D is inputted to the data processing section (not shown) to be subjected to a specified image processing, and the processed data is inputted to image displaying means (not shown) to be displayed as a visible image on the image displaying means.

Figure 5A:
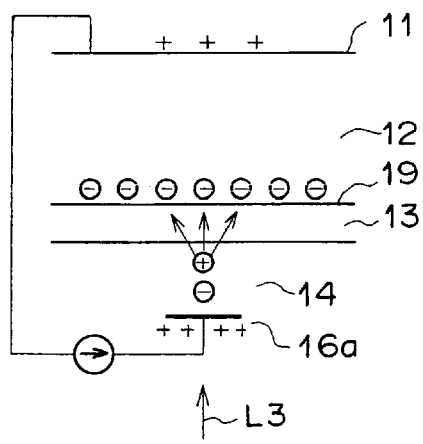
FIG. 5A to FIG. 5D are drawings illustrating the effect of the microplate.
Figure 5B:
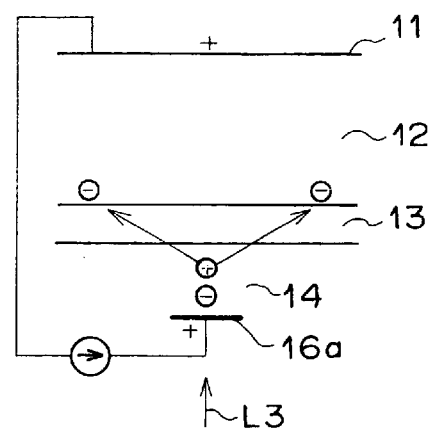
Figure 5C:
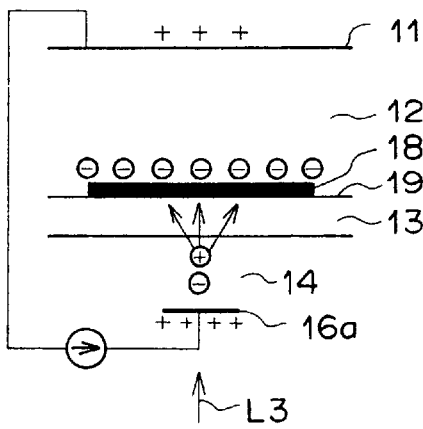
Figure 5D:
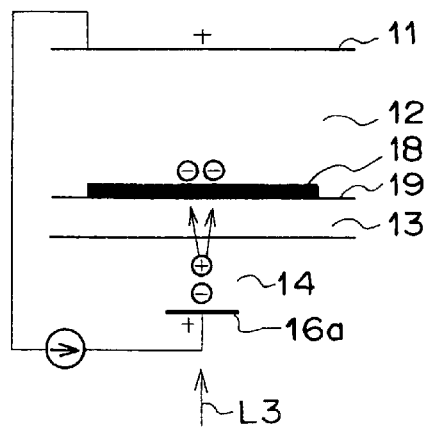

Here, because the charge storing section 19 is provided with the microplates 18, in the reading process (the charge-recoupling process and the discharging process), the latent image charges around the respective microplates 18 can be attracted toward the central portion of the microplates, which allows the latent image charges to be more sufficiently discharged, resulting in the quantity of unread charges being minimized. FIG. 5A to FIG. 5D are drawings illustrating the effect of the microplate 18 provided in the reading process. FIG. 5A and FIG. 5B are drawings for conventional detectors, where no microplates 18 are provided, and FIG. 5C and FIG. 5D are drawings for the detector according to the present invention, where microplates 18 are provided.

As shown in FIG. 5A to FIG. 5D, the reading light L3 is projected onto the photoconductive layer for reading, 14, through the element 16*a* to generate pairs of charges, positive and negative, in the photoconductive layer for reading, 14. In recoupling of the positive charges of the generated charges with latent image charges in the charge storing section 19, recoupling is substantially performed, starting from the charge in the location opposite to and the nearest to the element 16*a*. In other words, at the beginning of reading, the negative charge in the pixel central portion is cancelled by charge-recoupling, and then the charges outside that portion are sequentially charge-recoupled (FIG. 5A). When no microplate 18 is provided, the latent image charges in the charge storing section 19 are not caused to have the same potential, being left in the respective stored locations. Therefore, as the reading progresses, charges in locations more distant from the element 16*a* must be read, causing the difficultly in reading to be increased, and in the final process, charges may be left unread (FIG. 5B).

On the other hand, when a microplate 18 is provided, the negative charge in the pixel central portion is cancelled by charge-recoupling at the beginning of reading, and then the charges outside that portion are sequentially charge-recoupled (FIG. 5C), but the charges stored on the microplate 18 are always held at the same potential. Consequently, as the reading progresses, the latent image charges are gradually moved to the central portion of the microplate 18, i.e., the pixel central portion. Therefore, even in the final process, charge-recoupling with a latent image charge is performed in the pixel central portion, which provides the smallest distance between the microplate 18 and the second conductive layer 15, i.e., the strip electrode 16, and as a result provides the highest discharge efficiency, and the discharge can be easily continued with no charges being left unread (FIG. 5D).

Figure 6A:
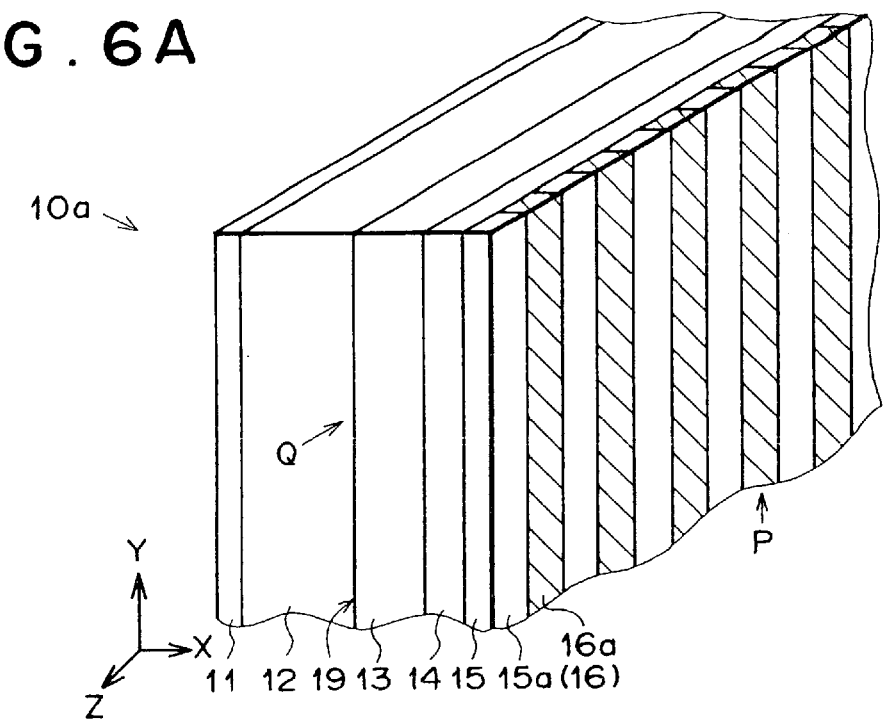
FIG. 6A is a perspective side view of a solid-state radiation detector of a second embodiment according to the present invention.
Figure 6B:
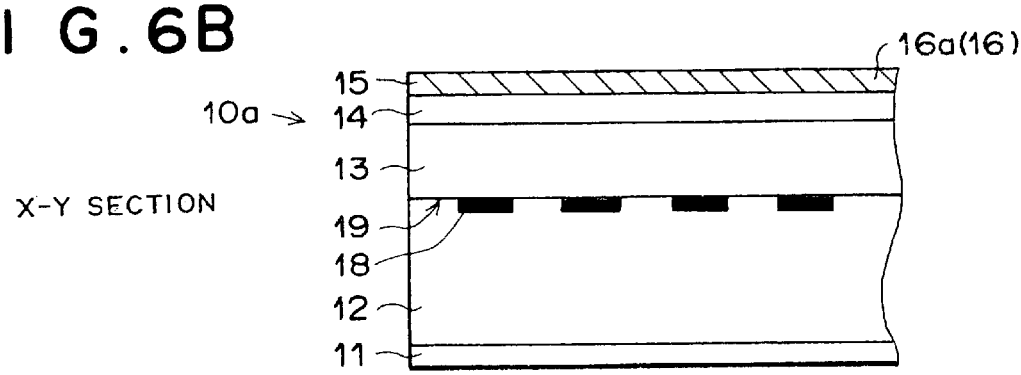
FIG. 6B is an X-Y sectional drawing of the portion shown by the arrow-P.
Figure 6C:
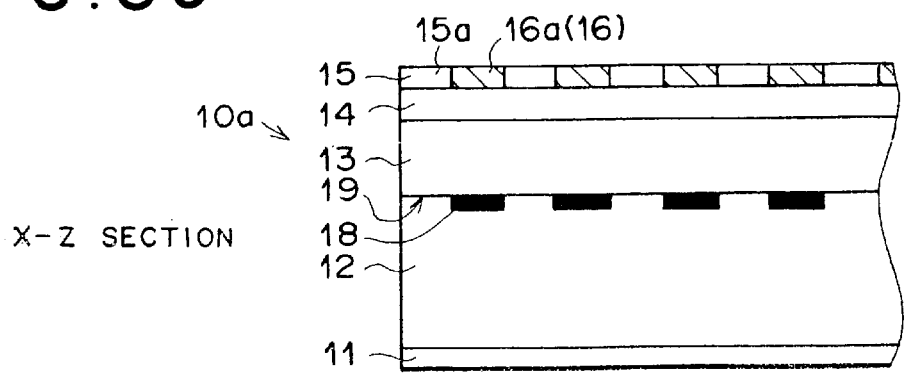
FIG. 6C is an X-Z sectional drawing of the portion shown by the arrow-Q.

FIG. 6A to FIG. 6C are drawings illustrating the schematic configuration of a solid-state radiation detector according to a second embodiment of the present invention, FIG. 6A being a perspective side view, FIG. 6B being an X-Y sectional drawing of the portion shown by the arrow-P, and FIG. 6C being an X-Z sectional drawing of the portion shown by the arrow-Q. In FIG. 6A to FIG. 6C, any element equivalent to that of the detector 10 according to the first embodiment as shown in FIG. 1A to FIG. 1C is provided with the same reference numeral, and the description about it will be omitted except when required. As a record-reading device using this detector 10*c*, the above-stated device 120 can be used.

With the detector 10*a* according to the second embodiment, the length of the side of each microplate 18 is specified to be smaller than the pixel pitch, i.e., less than half of the arrangement pitch for the elements 16*a*. As shown in FIG. 6B and FIG. 6C, each microplate 18 is located just below the element 16*a*, i.e., in the central portion of the pixel, and the microplates 18 are disposed at the pixel pitch for the longitudinal direction of the elements 16*a*.

Figure 7A:
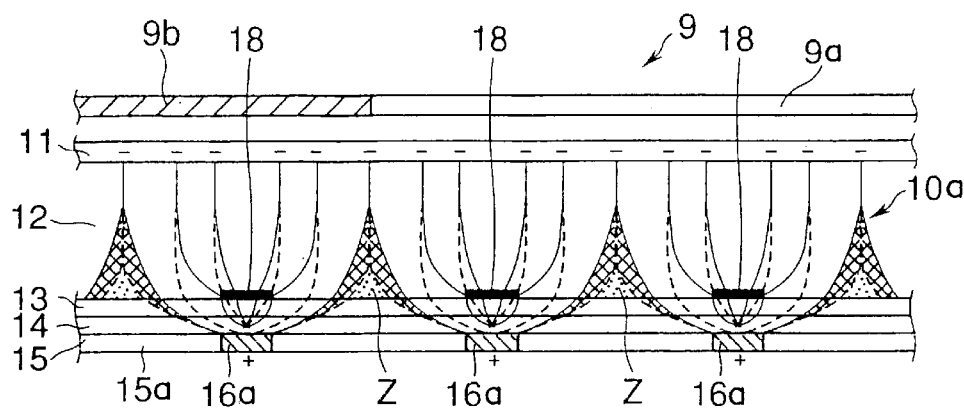
FIG. 7A to FIG. 7C are drawings illustrating the method for recording a static latent image in the solid-state radiation detector according to the second embodiment.
Figure 7B:
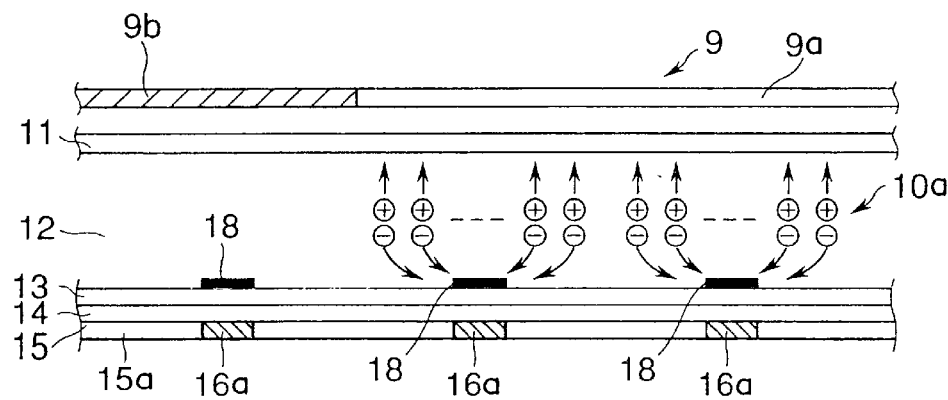
Figure 7C:
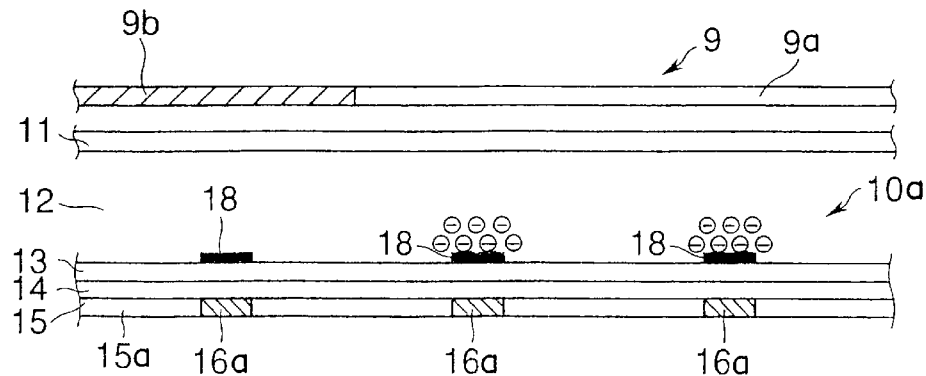
Figure 8A:
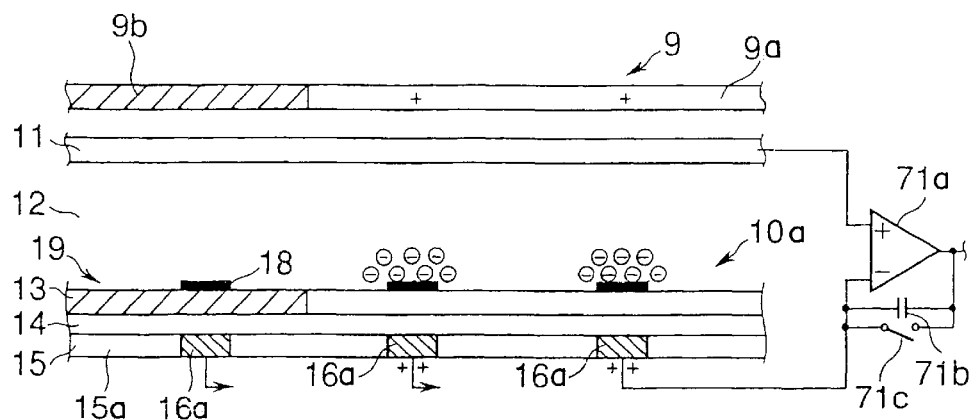
FIG. 8A to FIG. 8C are drawings illustrating the method for reading out a static latent image recorded in the solid-state radiation detector according to the second embodiment.
Figure 8B:
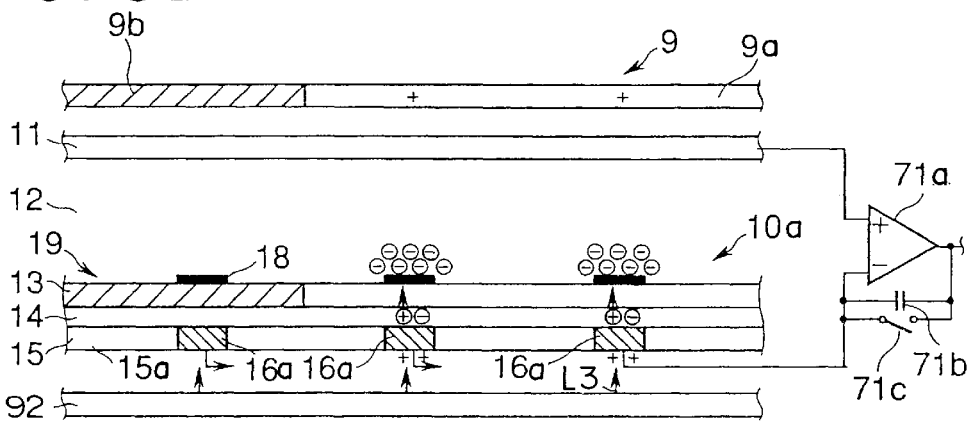
Figure 8C:
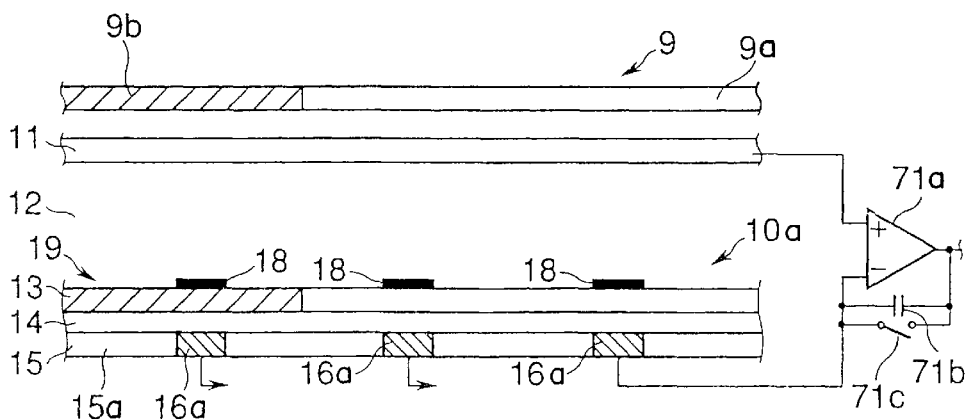

An electric charge model in the static latent image recording process when the detector 10*a* is used is shown in FIG. 7A to FIG. 7C, while that in the static latent image reading process is shown in FIG. 8A to FIG. 8C.

In the recording process, the U-shaped electric field is further concentrated on the microplate 18, i.e., the pixel central portion in the vicinity of the charge storing section 19, because, in the charge storing section 19, the microplate 18 which is shorter than the pixel pitch is provided for the respective elements 16*a* of the stripe electrode 16. Therefore, as the hatched areas indicated with an arrow Z in FIG. 7A, large areas where no electric field is given are formed in the charge storing the section 19.

The negative charges generated in the photoconductive layer for recording, 12, are transferred along this electric field so that they are concentrated on the respective microplates 18 (FIG. 7B). They are then stopped, caught by the respective microplates 18, and stored on the microplates. The charge transporting layer 13 acts as an insulator for charges having the same polarity as that of the charges stored in the electrode layer 11, (in this example, a negative charge), i.e., the latent image charges. This means that of the negative charges which have been transferred in the photoconductive layer for recording, 12, the charges which have not been caught by the microplates 18 are stopped in the charge storing section 19, which is the boundary between the photoconductive layer for recording, 12, and the charge transporting layer 13. As a result, charges are stored not only on the respective microplates 18, but also around them in the charge storing section 19, and as a result, the negative charges are stored as the latent image charges on and around the respective microplates 18 (FIG. 7D).

Thus, with the detector 10*a*, the latent image charges are stored on and around the respective microplates 18, which means that the pixels can be formed in the fixed locations for both the horizontal scanning and the vertical scanning, and for both scanning directions, the static latent image can be recorded with high sharpeness (spatial resolution).

On the other hand, in the reading process, the latent image charges are sequentially cancelled, starting from those in the central portion, as with the above-stated detector 10. The microplate 18 for the detector 10*a* is smaller than that for the detector 10, the latent image charges being stored not only on the respective microplates 18 but also around them (FIG. 8A), and the latent image charges stored around the microplate 18 cannot be said to always have the same potential as those on it, being left in their original locations if the reading is progressed. However, in the recording process, the latent image charges are stored, being concentrated on the respective microplates 18, which means that they are stored in the respective pixel central portions at a higher intensity than when the microplates 18 are not provided, which reduces the possibility of charges being left unread in the final process of reading (FIG. 8B and FIG. 8C). In addition, because the charges are stored not only on the respective microplates 18, but also around them, the quantity of the stored charges will not be reduced, and the level of the image signal obtained by reading will not be lowered. In other words, with this detector 10a, the image signal level is not deteriorated, and it is possible to form the pixels in the fixed locations on the detector, and to realize both improvement of the reading efficiency and enhancement of the sharpeness.

Figure 9A:
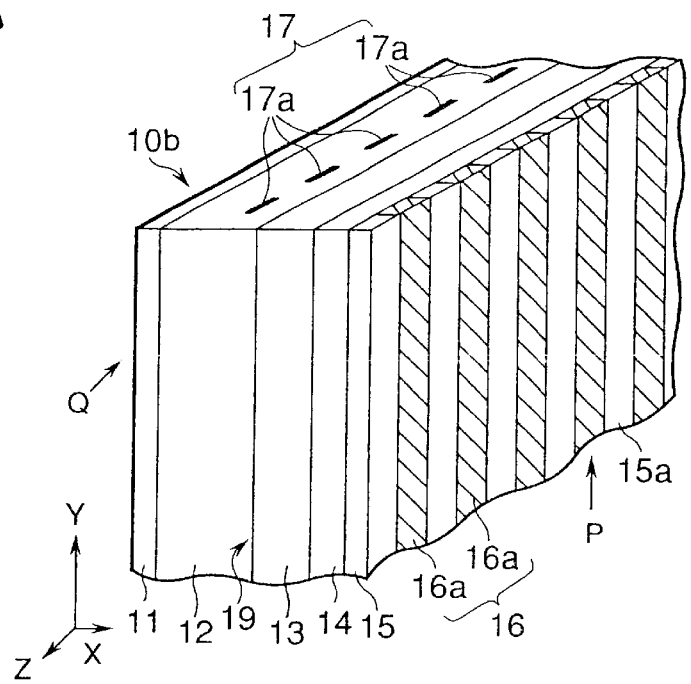
FIG. 9A is a perspective side view of a solid-state radiation detector of a third embodiment according to the present invention.
Figure 9B:
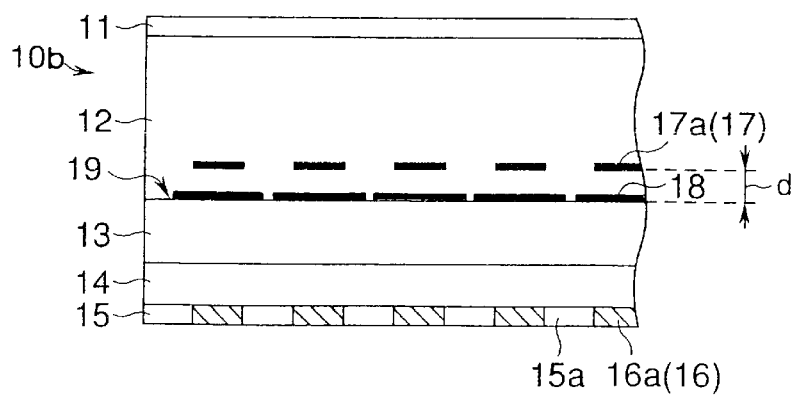
FIG. 9B is an X-Z sectional drawing of the portion shown by the arrow-Q.
Figure 9C:
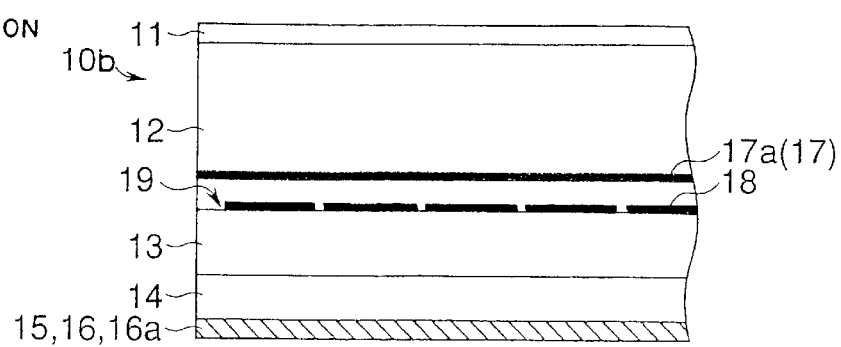
FIG. 9C is an X-Y sectional drawing of the portion shown by the arrow-P.
Figure 10A:
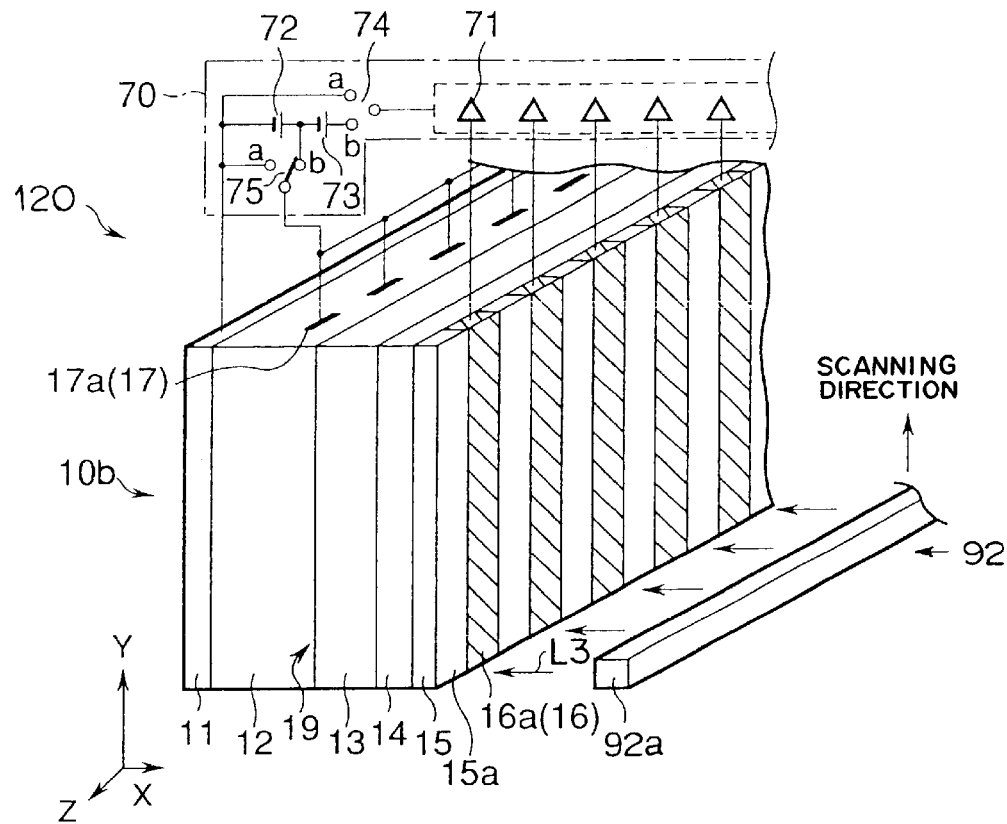
FIG. 10A and FIG. 10B are schematic diagrams for a record-reading device using the solid-state radiation detector according to the third embodiment.
Figure 10B:
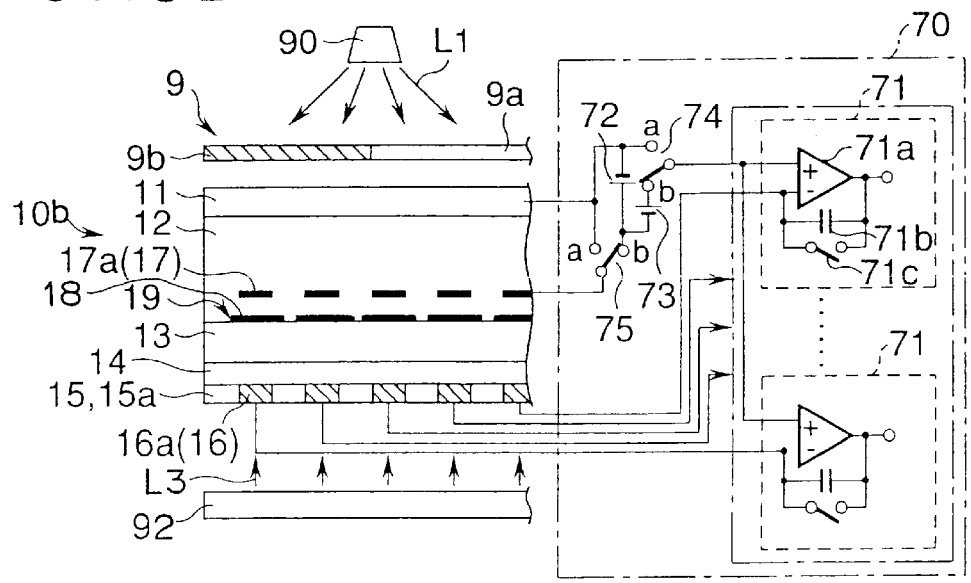

FIG. 9A to FIG. 9C are drawings illustrating the schematic configuration of a radiation solid-state detector according to a third embodiment of the present invention, FIG. 9A being a perspective side view, FIG. 9B being an X-Z sectional drawing of the portion shown by the arrow-Q, and FIG. 9C being an X-Y sectional drawing of the portion shown by the arrow-P. FIG. 10A and FIG. 10B are schematic diagrams for the principal section of a radiation image record-reading device 120 which uses the radiation solid state detector according to the third embodiment. In FIG. 9A to FIG. 9C, any element equivalent to that of the detector 10 and the record-reading device 110 according to the first embodiment as shown in FIG. 1A to FIG. 1C and FIG. 2A to FIG. 2B is provided with the same reference numeral, and the description about it will be omitted except when required.

This detector 10b according to the third embodiment of the present invention has, a sub-electrode 17 with a number of elements 17a arranged in the form of stripes provided at a location close to the charge transporting layer 13 in the photoconductive layer for recording, 12 (more specifically, refer to Japanese Patent Application No. 11 (1999)- 87922 filed on the same date as that for the present application). This sub-electrode 17 is a conductive member for outputting an electric signal at a level corresponding to the quantity of the latent image charges stored in the charge storing section 19 formed roughly at the boundary between the photoconductive layer for recording, 12, and the charge transporting layer 13.

FIG. 11A to FIG. 11D are perspective side views illustrating the arrangement relationship among the element 17a, the microplates 18, and the element 16a. As shown in the figures, each element 17a of the sub-electrode 17 is located just above the element 16a of the stripe electrode 16, both being disposed so that they are opposite to each other. The microplates 18 are located between the locations where the element 16a and the element 17a are, being opposite to each other, and are arranged at the pixel pitch for the longitudinal direction.

The sub-electrode 17 is only required to be conductive, and can be produced from a single metal, such as gold, silver, chromium, and platinum, or an alloy, such as indium oxide.

Figure 11A:
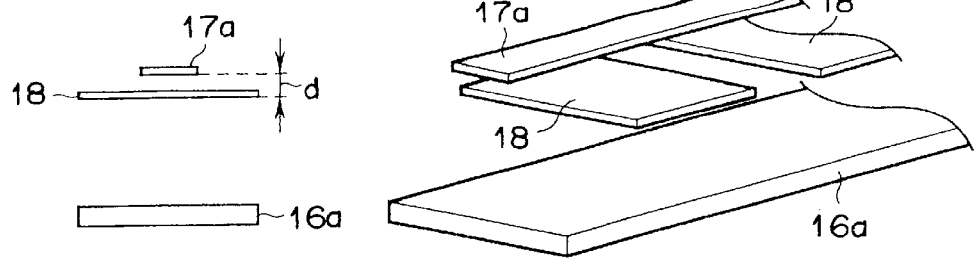
FIG. 11A to FIG. 11D are perspective side views illustrating the arrangement relationship among the microplates and the elements.
Figure 11B:
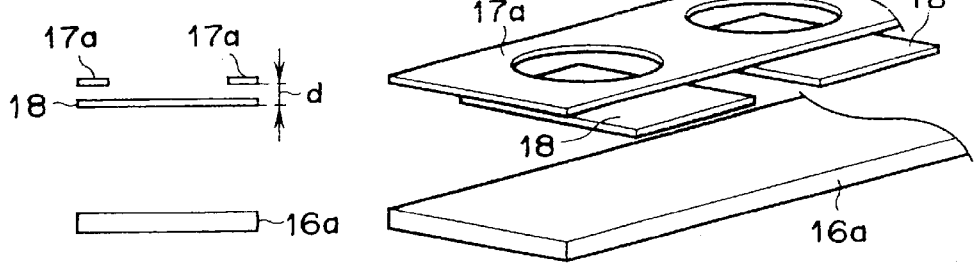
Figure 11C:
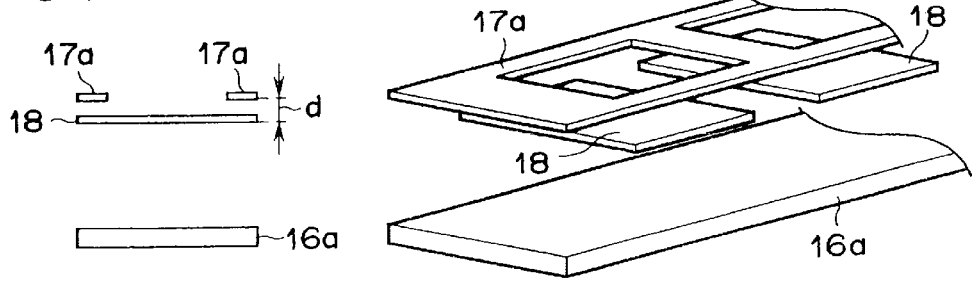
Figure 11D:
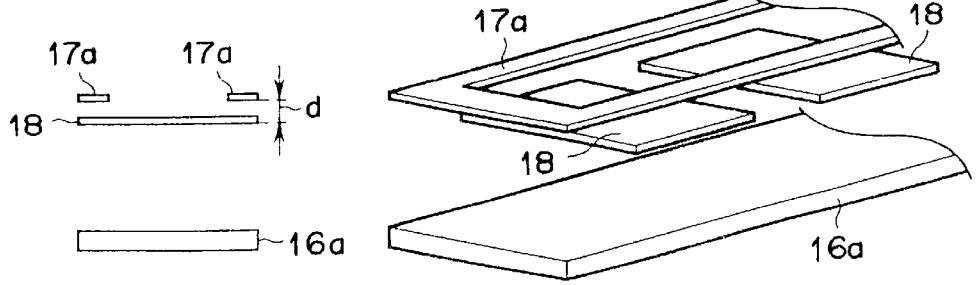

Each element 17a may be of any shape, such as columnar or prismatic, so long as it has a long and slender shape overall, but it is preferable that each element 17a be particularly a flat plate electrode. As shown in FIG. 11A, the width of the element 17a may be set narrower than the width of the element 16a. As shown in FIG. 11B and FIG. 11C, the element 17a may be a flat plate electrode in which a number of round or square holes are provided so that they are disposed in the locations corresponding to the pixels for the longitudinal direction. As shown in FIG. 11D, the element 17a may be a flat plate electrode in which one elongated rectangular hole is provided, and both longitudinal ends thereof are connected to each other. By thus making the element 17a narrower than the element 16a, or providing a hole(s) having a specified shape for the element 17a along the longitudinal direction thereof, the possibility of the element 17a hindering the transfer of the latent image charges and having an adverse effect on the latent image forming process on the latent image charges stored in the charge storing section 18, 19 can be eliminated.

With the microplate 18 as shown in FIG. 11A to FIG. 11D, the length of the side of each microplate 18 is specified to be a dimension approximately equal to the pixel pitch as that for the above-stated detector 10. Of course, as for the above-stated detector 10a, it may be smaller than the pixel pitch.

The reading section 70 of the record-reading device 120 using this detector 10b has a number of current detection amplifiers 71 connected to the elements 16a of the stripe electrode 16 as shown in FIG. 10A and FIG. 10B. The current detection amplifiers 71 each comprise an operational amplifier 71a, an integrating capacitor 71b, and a switch 71c. The electrode layer 11 in the detector 10b is connected to the respective one inputs 74a and 75a of the switches 74 and 75, and to the negative electrode of the power supply 72. The positive electrode of the power supply 72 is connected to the negative electrode of the power supply 73 and the other input 75b of the switch 75. The positive electrode of the power supply 73 is connected to the other input 74b of the switch 74. The non-inverting input terminal (+) of each operational amplifier 71a is commonly connected to the output of the switch 74, and the inverting input terminal (−) is individually connected to the element 16a. The output of the switch 75 is commonly connected to each element 17a.

In recording, the switches 74 and 75 are both connected to the respective "b" terminals, and the specified supply voltage by the power supplies 72 and 73 is applied across the electrode layer 11 and the stripe electrode 16 through the imaginary short circuit in the operational amplifiers. The power supply 73 also functions as control voltage applying means, and in recording, a DC voltage as a control voltage is applied to the sub-electrode 17 from this power supply 73. This supply voltage is set at a voltage which causes the electric field formed across the electrode layer 11 and the stripe electrode 16, particularly, the potential gradient in the photoconductive layer for recording, 12, to be roughly the same as that which would be formed when no sub-electrode 17 is provided, so that the latent image charges can be stably stored in the charge storing section 19. The sub-electrodes 17 may be left open without any control voltage being applied to it in recording.

On the other hand, in reading, the switches 74 and 75 are both connected to the respective "a" terminals, and the linear reading light is projected onto the stripe electrode 16, with the respective current detection amplifiers 71 concurrently detecting the current flowing through the respective elements 16a for the respective elements 16a connected to them. The configurations of the current detection circuit 70 and the current detection amplifier 71 are not limited to those in this example, and a variety of configurations may be used (for example, refer to Japanese Patent Application No. 10 (1998)-232824 and Japanese Patent Application No. 10 (1998)-271374).

In this example, the circuitry is configured so that a DC voltage is applied to the sub-electrode 17 from this power supply 73 in recording. However, a special power supply for the sub-electrode 17 may be provided independently of the power supply for applying the DC voltage across the electrode layer 11 and the stripe electrode 16 so that the control voltage having a desired waveform is applied to adjust the electric field in recording to a more preferable one.

Figure 12A:
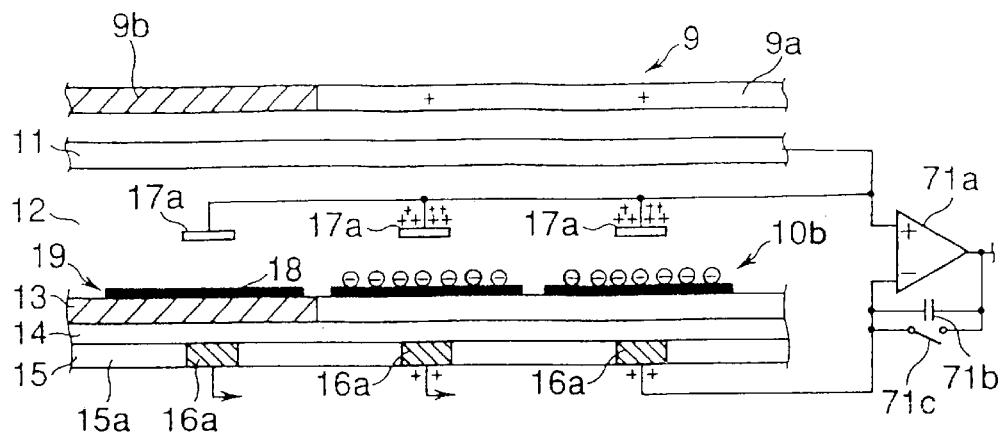
FIG. 12A to FIG. 12C are drawings illustrating the method for reading out a static latent image recorded in the solid-state radiation detector according to the third embodiment.
Figure 12B:
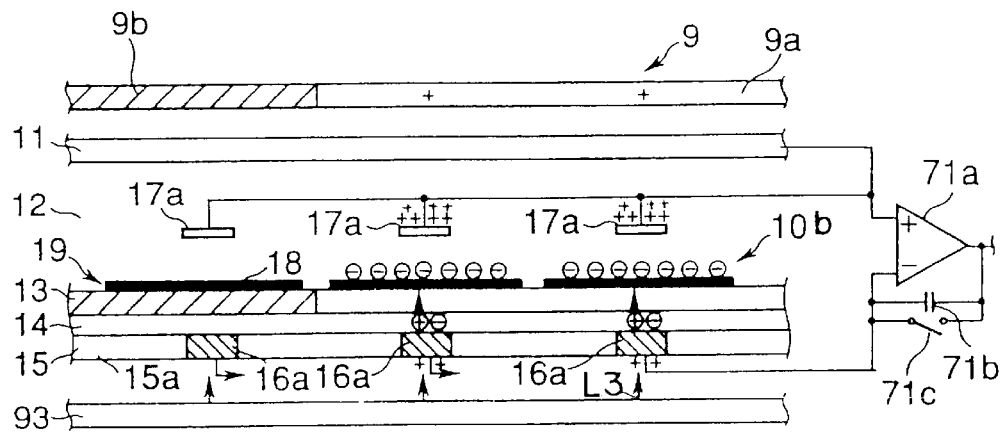
Figure 12C:
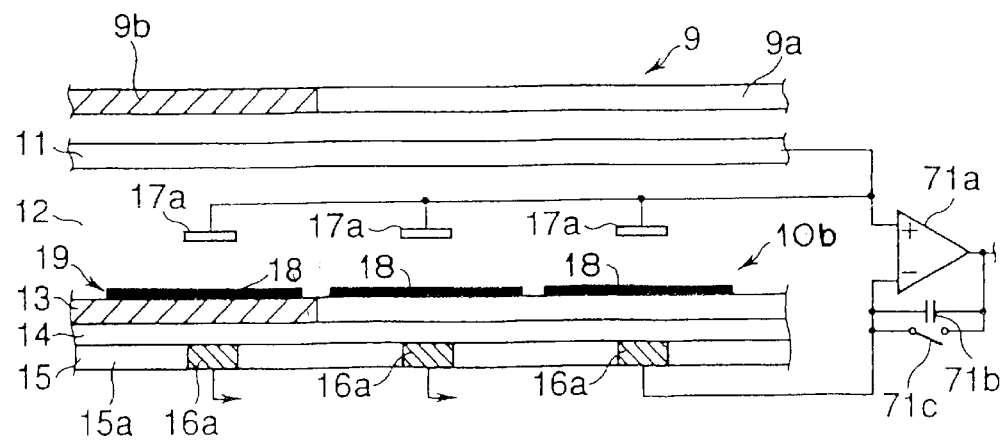

Hereinbelow, the method for recording image information as a static latent image in the detector 10b and reading out the recorded static latent image will be briefly described with respect to differences from the case where the above-stated detector 10 is used. FIG. 12A to FIG. 12C illustrate the process of reading out a static latent image by using a charge model as with FIG. 4A to FIG. 4C. The charge model illustrating the static latent image reading process can be considered to be the same as that as shown in FIG. 3A to FIG. 3C.

When recording a static latent image in the detector 10b, first of all the switches 74 and 75 are both turned to the respective "b" terminals to apply a DC voltage across the electrode of the electrode layer 11 and the stripe electrode 16 for electrifying both. At this time, a control voltage to allow the latent image charges to be stably stored in the charge storing section 19 is applied to the sub-electrode 17 as stated above so that the potential gradient in the photoconductive layer for recording, 12, is not disarranged. In this way, any charges generated in the photoconductor layer 12 are handled in recording as if the sub-electrode 17 were not provided.

As is the case when the above-stated detector 10 is used, when the radiation L1 is projected on the subject 9, the negative charges generated in the photoconductive layer for recording, 12, are stored on the microplates 18 as latent image charges. In other words, also when this detector 10b is used, pixels can be formed at the fixed locations for both the horizontal scanning and the vertical scanning.

When reading the static latent image from the detector 10b, the switches 74 and 75 are first both turned to the respective "a" terminals to connect the electrode layer 11 in the detector 10b in which the static latent image has been recorded, to the sub-electrode 17, and also to connect the stripe electrode 16 through the imaginary short circuit in the operational amplifier 71a to electrify these electrodes to the same potential to rearrange the charges (FIG. 12A). In order to read out the image signal concurrently for the respective elements 16a of the stripe electrode 16, the charges are rearranged concurrently for all the elements 17a. In this case, in the pixel locations other than those where reading is carried out with the reading light L3 in vertical scanning, the element 16a is opposed to the element 17a, resulting in the distributed capacitance which does not contribute to the signal reading being increased, and this is disadvantageous from the viewpoint of constant noise. However, because the element 17a is not switched over, no switching noise is produced.

Then, as is the case with the above-stated detector 10 being used, the reading light source 92a is moved along the longitudinal direction of the elements 16a to scan the entire surface of the detector 10b. This scanning with the reading light L3 generates pairs of charges, positive and negative, in the locations in the photoconductive layer 14 which correspond to the vertical scanning positions and where the reading light L3 is projected (FIG. 12B). The positive charges generated in the photoconductive layer 14 are rapidly transferred in the charge transporting layer 13, being attracted by the latent image charges stored in the charge storing section 19, and are charge-recoupled with the latent image charges in the charge storing section 19, being cancelled (FIG. 12C). On the other hand, the negative charges generated in the photoconductive layer for reading, 14, are cancelled by being charge-recoupled with the positive charges on the electrode of the electrode layer 11, the stripe electrode 16, and the sub-electrode 17 (FIG. 12C).

Then, as is the case when the above-stated detector 10 is used, the current detection amplifiers 71 concurrently detect the current flowing through the imaginary short circuit in the operational amplifier 71a for the respective elements 16a.

Here, the detector 10b is provided with the same microplates 18 as those for the above-stated detector 10, which means that, it is easier to sufficiently discharge latent image charges around the respective microplates 18, which allows the reading efficiency to be improved. If the same microplates 18 as those for the above-stated detector 10a are used, enhancement of the sharpeness can also be realized.

The difference between the case where the detector 10, 10a is used, and that where the detector 10b is used lies in the difference in the quantity of charges which can be taken out. In other words, when the detector 10, 10a is used, a capacitor $C_{*a}$ is formed between the electrode layer 11 and the charge storing section 19 which sandwich the photoconductive layer for recording 12. Also, a capacitor $C_{*b}$ is formed between the charge storing section 19 and the stripe electrode 16 (the elements 16a) which sandwich the charge transporting layer 13 and the photoconductor layer for reading, 14. The sum $Q_+$ of the quantities $Q_{+a}$ and $Q_{+b}$ of the positive charges distributed to the capacitors $C_{*a}$ and $C_{*b}$ in the charge rearrangement is equal to the quantity $Q_-$ of the latent image charges, and the quantities $Q_{+a}$ and $Q_{+b}$ of the positive charges distributed are proportional to the capacitance values $C_a$ and $C_b$ of the respective capacitors. The quantity of charges which can be taken out to the outside of the detector 10, i.e., the quantity Q of the signal charges representing the radiation image information, is equal to the quantity $Q_{+a}$ of positive charges distributed to the capacitor $C_{*a}$. In other words, the full quantity of latent image charges cannot be taken out.

On the other hand, when the detector 10b is used, a capacitor $C_{*c}$ is formed between the sub-electrode 17 (the element 17a) and the charge storing section 19 which sandwich part of the photoconductive layer for recording, 12, and the sum $Q_+$ of the quantities $Q_{+a}$, $Q_{+b}$, and $Q_{+c}$ of the positive charges distributed to the capacitors $C_{*a}$, $C_{*b}$, and $C_{*c}$ in the charge rearrangement is equal to the quantity $Q_-$ of the latent image charges, and the quantities $Q_{+a}$, $Q_{+b}$, and $Q_{+c}$ of the positive charges distributed are proportional to the capacitance values $C_a$, $C_b$, and $C_c$ of the respective capacitors. The quantity Q of the signal charges which can be taken out to the outside of the detector 10b is equal to the sum of the quantities $Q_{+a}$ and $Q_{+c}$ of the positive charges distributed to the capacitors $C_{*a}$ and $C_{*c}$, i.e., $(Q_{+a}+Q_{+c})$.

If the capacitance values of the capacitors $C_{*a}$, $C_{*b}$, and $C_{*c}$ are taken into consideration, it will be clear that the sub-electrode 17 is provided in the photoconductive layer for recording, 12, at the location separated by the distance "d" from the charge storing section 19, which is the boundary between the photoconductive layer for recording, 12, and the charge transporting layer 13, and on the other hand, the electrode layer 11 is provided in the location much farther than the distance "d". This means the capacitance value $C_c$ of the capacitor $C_{*c}$, which is formed between the sub-electrode 17 and the charge storing section 19 through the photoconductive layer for recording 12, is sufficiently higher than the capacitance value $C_a$ of the capacitor $C_{*a}$, which is formed between the electrode layer 11 and the charge storing section 19 through the photoconductive layer for recording, 12. On the other hand, providing the sub-electrode 17 as stated above will have almost no practical effect on the capacitance value $C_b$ of the capacitor $C_{*b}$, which is formed between the stripe electrode 16 and the charge storing section 19 through the photoconductive layer for reading, 14, and the charge transporting layer 13. As a result, when the detector 10b is used, the quantity $Q_{+b}$ of the positive charges distributed to the capacitor $C_{*b}$ can be reduced to below that when the sub-electrode 17 is not provided.

As a result of this, notwithstanding that the sum of the thickness of the charge transporting layer 13 and that of the photoconductive layer for reading, 14, is smaller than the thickness of the photoconductor layer for recording, 12, providing the sub-electrode 17 can increase the quantity Q of the signal charges or the signal current I which can be taken out from the detector 10 to the outside, i.e., the reading efficiency, resulting in the S/N ratio for the reproduced image being improved.

Because the capacitance value $C_c$ of the capacitor $C_{*c}$ can be increased to a value sufficiently higher than the capacitance value $C_a$ of the capacitor $C_{*a}$, the quantity $Q_{+c}$ of the positive charges distributed to the capacitor $C_{*c}$ can be increased to a quantity sufficiently larger than the quantity $Q_{+a}$ of the positive charges distributed to the capacitor $C_{*a}$ and the current $I_c$ flowing out from the capacitor $C_{*c}$ can be increased to a current sufficiently higher than the current $I_a$ flowing out from the capacitor $C_{*a}$. Consequently, if only the current $I_c$ flowing out from the capacitor $C_{*c}$ is detected through the sub-electrode 17, it can be expected that a sufficiently large image signal will be taken out.

Figure 13A:
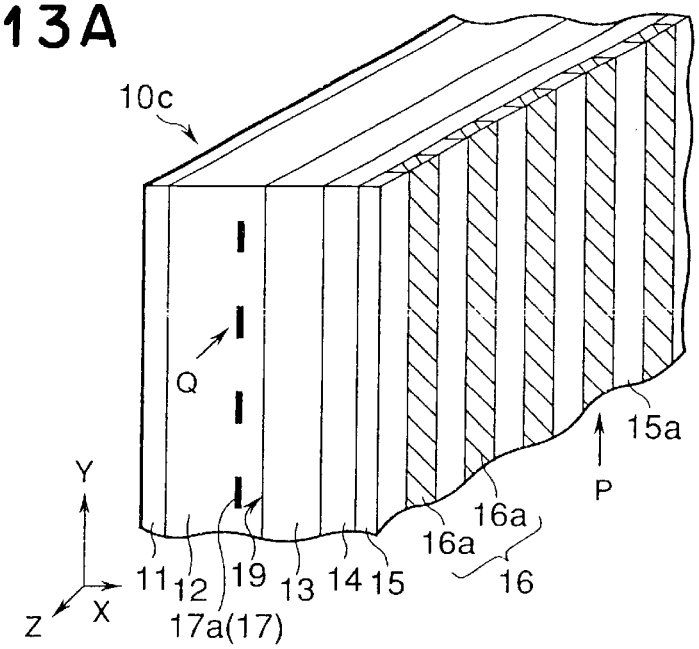
FIG. 13A is a perspective side view of a solid-state radiation detector of a fourth embodiment according to the present invention.
Figure 13B:
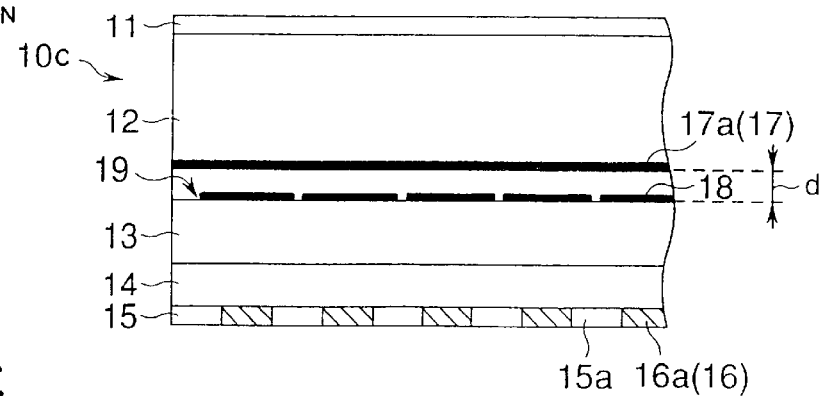
FIG. 13B is an X-Z sectional drawing of the portion shown by the arrow-Q.
Figure 13C:
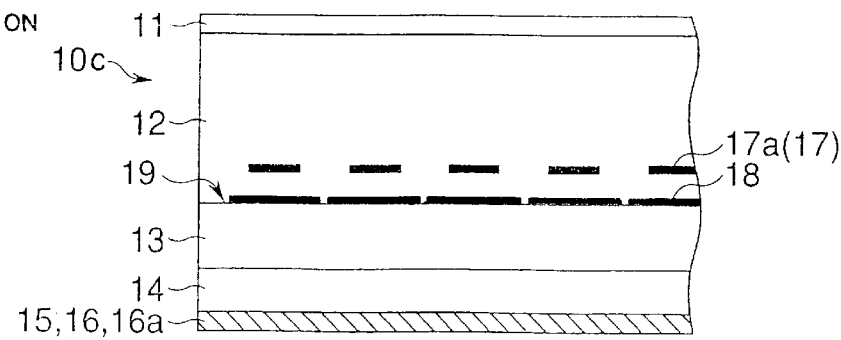
FIG. 13C is an X-Y sectional drawing of the portion shown by arrow-P.

FIG. 13A to FIG. 13C are drawings illustrating the schematic configuration of a radiation solid-state detector according to a fourth embodiment of the present invention, FIG. 13A being a perspective side view, FIG. 13B being an X-Z sectional drawing in the arrow-Q portion, and FIG. 13C being an X-Y sectional drawing in the arrow-P portion. In FIG. 13A to FIG. 13C, any element equivalent to that of the detector 10 according to the first embodiment as shown in FIG. 1A to FIG. 1C is provided with the same reference numeral, and the description about it will be omitted except when required. As a record-reading device using this detector 10c, the above-stated device 120 can be used.

With this detector 10c according to the fourth embodiment, the elements 17a of the sub-electrode 17 are disposed roughly orthogonally to the elements 16a of the stripe electrode 16. The microplate 18 is disposed in correspondence with the location where the element 16a intersects the element 17a. As with the detector 10, the microplates 18 used have roughly the same size as the pixel pitch so that charges are stored on the microplates 18, resulting in the reading efficiency being improved. Of course, by using the microplates 18 having the same size as that for the detector 10a, the sharpeness may also be improved. When pulsed light is to be projected as the reading light L3, the system is configured so that the pulsed light is projected at least to the locations in the photoconductive layer for reading, 14, which correspond to the locations where the microplates 18 are disposed.

FIG. 14A to FIG. 14C are drawings illustrating the schematic configuration of a radiation solid-state detector according to a fifth embodiment of the present invention, FIG. 14A being a perspective side view, FIG. 14B being an X-Z sectional drawing of the portion shown by the arrow-Q, and FIG. 14C being an X-Y sectional drawing of the portion shown by the arrow-P. In FIG. 14A to FIG. 14C, any element equivalent to that of the detector 10 according to the first embodiment as shown in FIG. 1A to FIG. 1C is provided with the same reference numeral, and the description about it will be omitted except when required. With this detector 10d according to the fifth embodiment, the charge transporting layer 13 for the above-stated detector 10c is removed. By the thickness corresponding to that of the charge transporting layer 13, the entire thickness of the detector 10d can be reduced. As a record-reading device using this detector 10d, the above-stated device 120 can be used.

The microplate 18 is disposed corresponding to the location where the element 16a intersects the element 17a. As with the detector 10, the microplates 18 used have roughly the same size as the pixel pitch. As stated above, when the microplates 18 provided have roughly the same size as the pixel pitch, the negative charges generated in the photoconductive layer for recording, 13, are stored on the microplates 18 in the recording process. Therefore, if the charge transporting layer 13, which has nonconductivity to the latent image charges, is not provided, the latent image charges can be stored and pixels can be formed at the fixed locations only with the microplates 18. The negative charges which have not been stored on the microplates 18 are passed through the photoconductive layer for reading, 14, and recoupled with the positive charges stored on the stripe electrode 16, thus being cancelled. In the reading process, the latent image charges around the respective microplates 18 can be attracted toward the central portion of them to be cancelled and discharged to improve the reading efficiency.

Figure 16A:
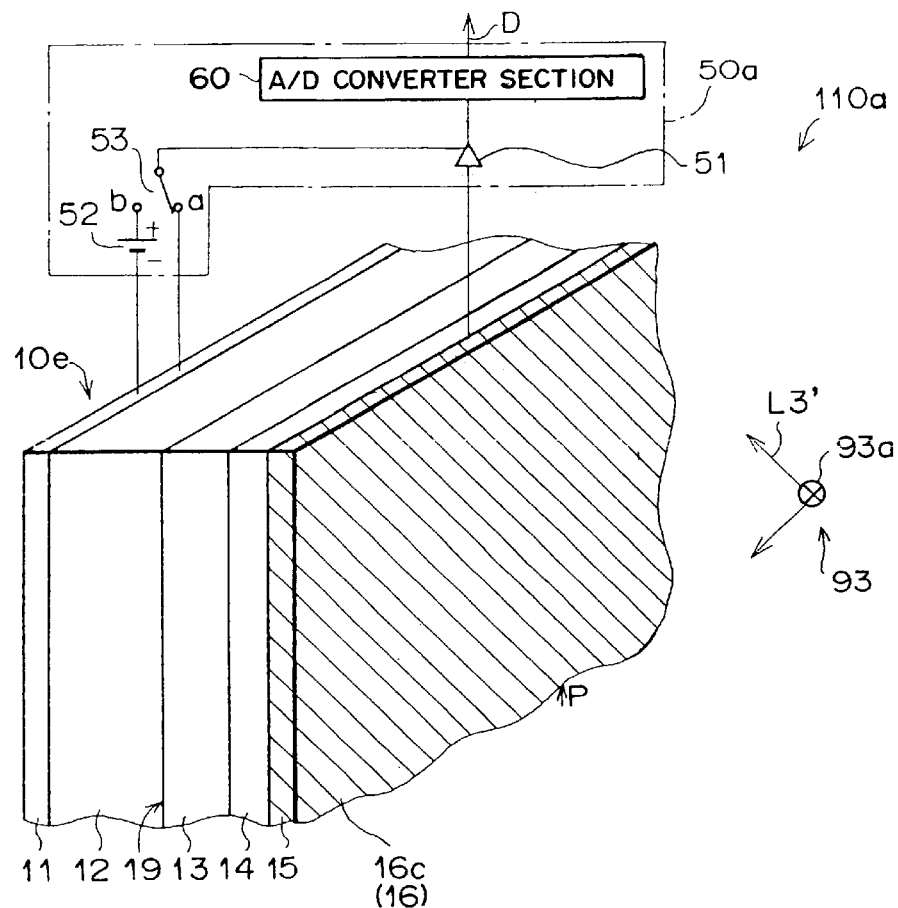
FIG. 16A and FIG. 16B are schematic configuration diagrams for a record-reading device using the solid-state radiation detector according to the sixth embodiment.
Figure 16B:
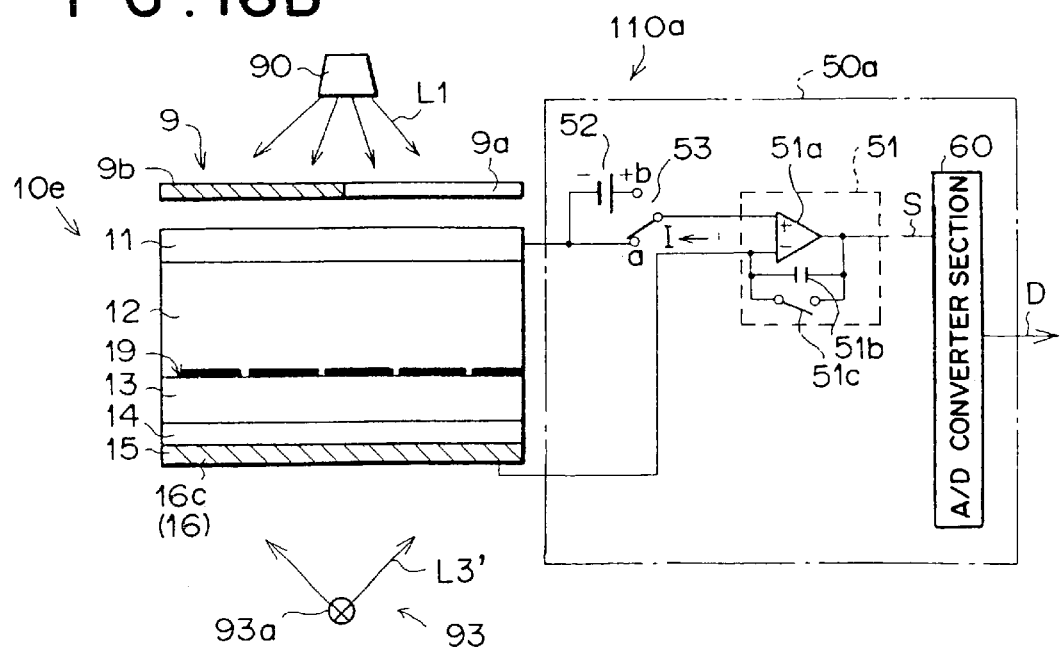

FIG. 15A to FIG. 15C are drawings illustrating the schematic configuration of a radiation solid-state detector according to a sixth embodiment of the present invention, FIG. 15A being a perspective side view, FIG. 15B being an X-Y sectional drawing of the portion shown by the arrow-P, and FIG. 15C being an X-Z sectional drawing of the portion shown by the arrow-Q. FIG. 16A and FIG. 16B are schematic configuration diagrams for the principal section of a radiation image record-reading device 110a which uses the radiation solid state detector according to the sixth embodiment. In FIG. 15A to FIG. 15C and FIGS. 16A and 16B, any element equivalent to that of the detector 10 and the record-reading device 110 according to the first embodiment as shown in FIG. 1A to FIG. 1C, and FIG. 2A and FIG. 2B is provided with the same reference numeral, and the description about it will be omitted except when required. With this detector 10e according to the sixth embodiment, a flat plate electrode 16c is provided in place of the electrode of the electrode layer 15 in the above-stated detector 10.

In the charge storing section 19, which is the boundary between the photoconductive layer for recording, 12, and the charge transporting layer 13, a number of microplates 18 are discretely disposed, each being spaced apart from the adjacent microplates 18. With the detector 10, the microplates 18 are disposed just above the elements 16a of the stripe electrode 16, but with the detector 10e, the flat electrode 16c is provided instead, which means that the locations where the microplates 18 are disposed are the pixel locations themselves. As with the detector 10, the microplates 18 used have roughly the same size as the pixel pitch. Of course, by using the microplates 18 having the same size as that for the detector 10a, the sharpeness may also be improved.

As shown in FIG. 16A and FIG. 16B, a radiation image record-reading device 110a comprises the detector 10e, a reading section 50a as image data acquisition means for acquiring image data carrying radiation image information from the detector 10e in which the radiation image information has been recorded as a static latent image, a radiation source 90 which emits radiation, such as X-rays, toward the subject, and reading light projection means 93 having a reading light source 93a which emits reading light L3', such as infrared radiation and laser light, in the form of a beam converged into a small diameter beam.

The reading light projection means 93 scans the entire surface of the flat electrode 16c of the detector 10e with the reading light L3' in the form of a beam. When the reading light L3' in the form of a beam is emitted as pulsed light for scanning, the system is configured so that the reading light L3' is projected at least to the locations in the photoconductive layer for reading, 14, which correspond to the locations where the microplates 18 are disposed.

In the above-mentioned reading section 50 of the record-reading device 110 using the detector 10, the current detection amplifier 51 is provided for each element 16a, but in the reading section 50a of the record-reading device 110a using the detector 10e, only one current detection amplifier 51 is provided. The connection relationship between this current detection amplifier 51 and the other components is the same as that for the above mentioned reading section 50.

Figure 17A:
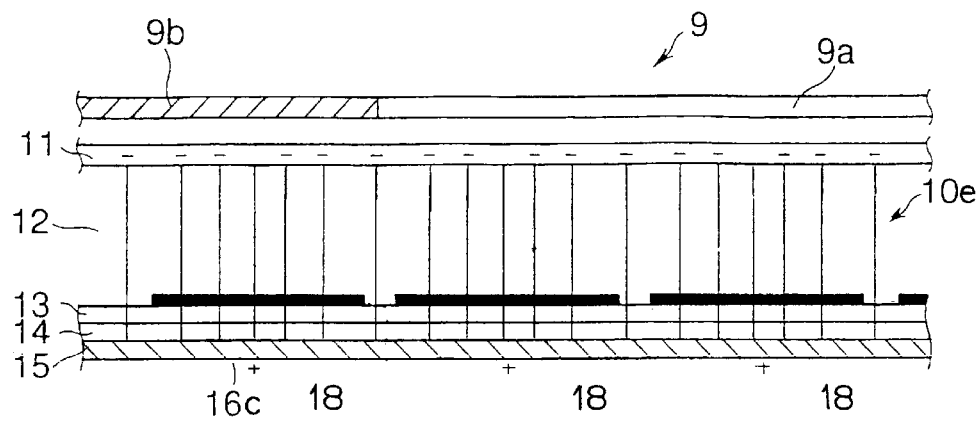
FIG. 17A to FIG. 17C are drawings illustrating the method for recording a static latent image in the solid-state radiation detector according to the sixth embodiment.
Figure 17B:
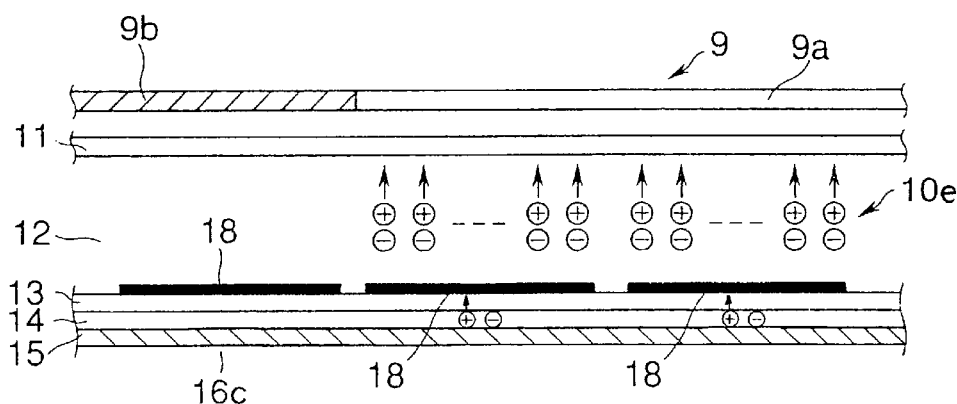
Figure 17C:
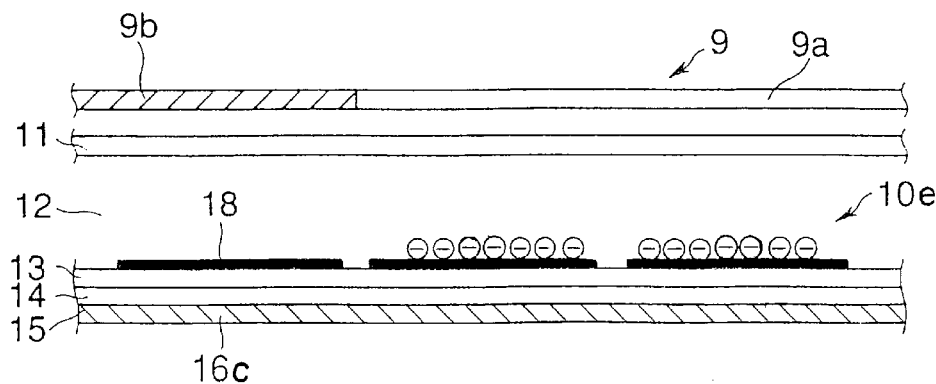

Next, the method for recording image information as a static latent image in the detector 10e and reading out the recorded static latent image will be briefly described with respect to what is different from the case where the above-stated detector 10 is used. FIG. 17A to FIG. 17C illustrate the process of recording a static latent image by using a charge model as with FIG. 3A to FIG. 3C, and FIG. 18A to FIG. 18C illustrate the process of reading out a static latent image by using a charge model as with FIG. 5A to FIG. 5D.

When, in the reading process, a DC voltage is applied across the electrode of the electrode layer 11 and the flat plate electrode 16c for electrifying both, a roughly parallel electric field is formed between the two electrodes. Because, in the charge storing section 19, the microplates 18 are provided, the parallel electric field is further concentrated on the microplate 18, i.e., the pixel central portion in the vicinity of the charge storage section 19 (FIG. 17A).

Figure 18A:
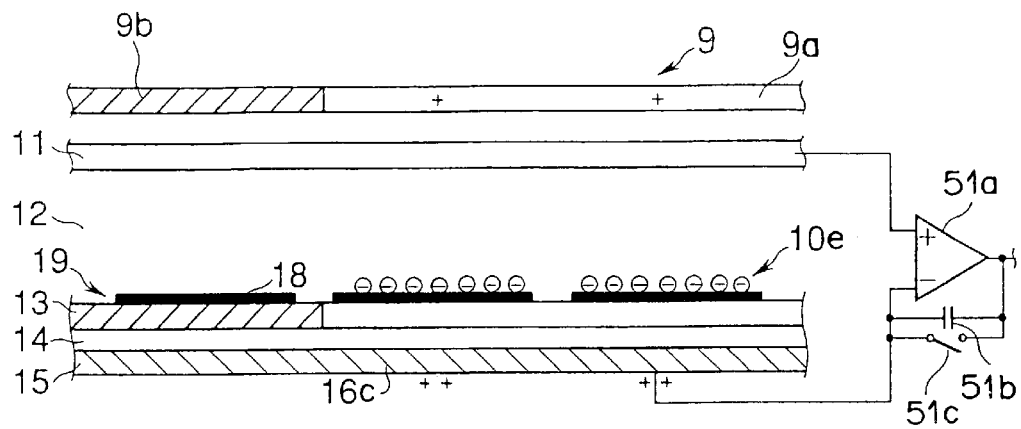
FIG. 18A to FIG. 18C are drawings illustrating the method for reading out a static latent image recorded in the solid-state radiation detector of the sixth embodiment.
Figure 18B:
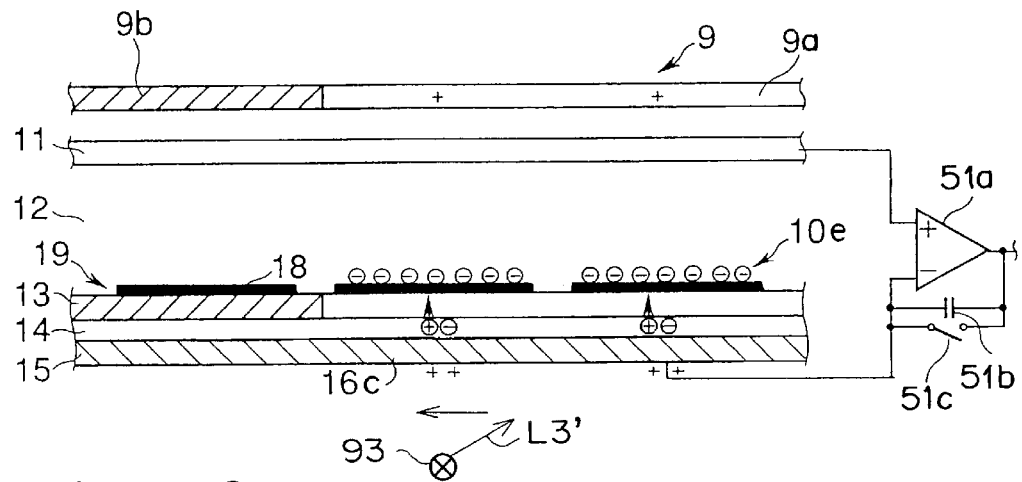
Figure 18C:
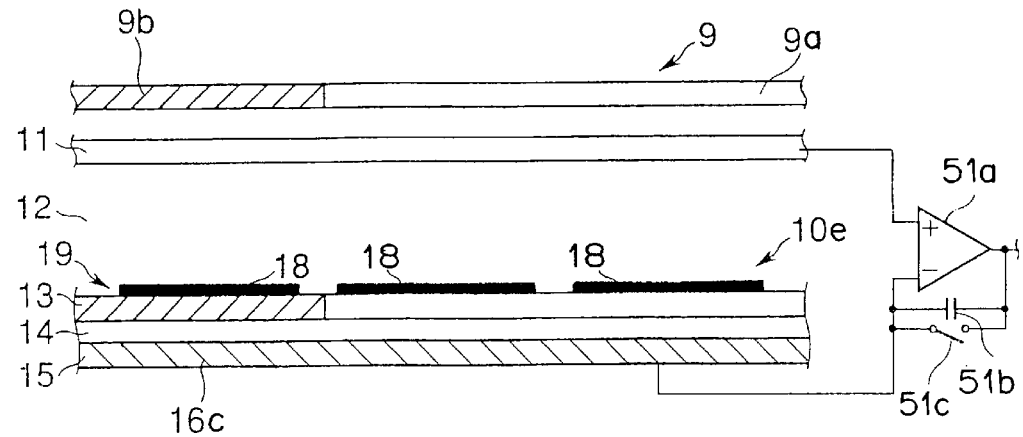

As is the case with the above-stated detector 10 being used, when the radiation L1 is projected on the subject 9, pairs of electric charges, positive and negative, are generated in the photoconductive layer for recording, 12 (FIG. 17B), and the negative charges are stored on the microplates 18 as latent image charges (FIG. 18C). In other words, also when this detector 10e is used, pixels can be formed i the fixed locations for both the horizontal scanning and the vertical scanning.

In reading out the static latent image from the detector 10e, the switch 53 is first turned to the "a" terminal to connect the electrode layer 11 in the detector 10e in which the static latent image has been recorded, to the flat plate electrode 16c through the imaginary short circuit in the operational amplifier 51a to rearrange the charges (FIG. 18A).

Then, the reading light L3' in the form of a beam is emitted from the reading light source 93, and with the reading light L3', the entire surface of the detector 10e is scanned. This scanning with the reading light L3' generates pairs of charges, positive and negative, in the locations in the photoconductive layer 14 which correspond to the scanning positions and where the reading light L3' is projected (FIG. 18B). The positive charges generated in the photoconductive layer 14 are rapidly transferred in the charge transporting layer 13, being attracted by the latent image charges in the charge storing section 19, and are cancelled by charge-recoupling with the latent image charges in the charge storing section 19 (FIG. 18C). On the other hand, the negative charges generated in the photoconductive layer 14 are cancelled by charge-recoupling with the positive charges on the electrode of the electrode layer 11 and the flat plate electrode 16c (FIG. 18C). In this case, because the microplates 18 are provided as with the above-stated detector 10, the latent image charges around the respective microplates 18 can also be sufficiently discharged, and thus the quantity of the charges left unread can also be minimized.

Then, as is the case where the above-stated detector 10 is used, the current flowing through the imaginary short circuit in the operational amplifier 51a is detected by the current detection amplifier 51 to read out the static latent image.

Figure 19A:
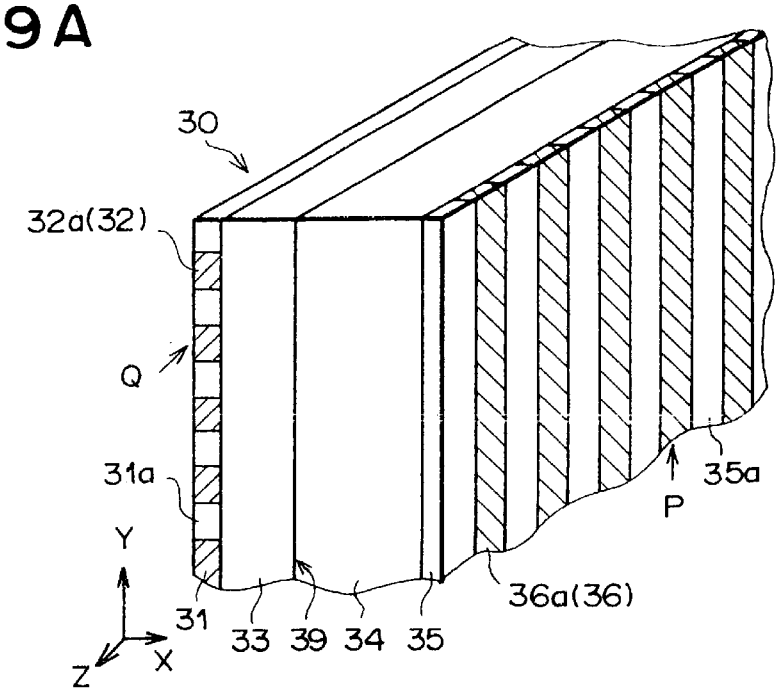
FIG. 19A is a perspective side view of a solid-state radiation detector of a seventh embodiment according to the present invention.
Figure 19B:
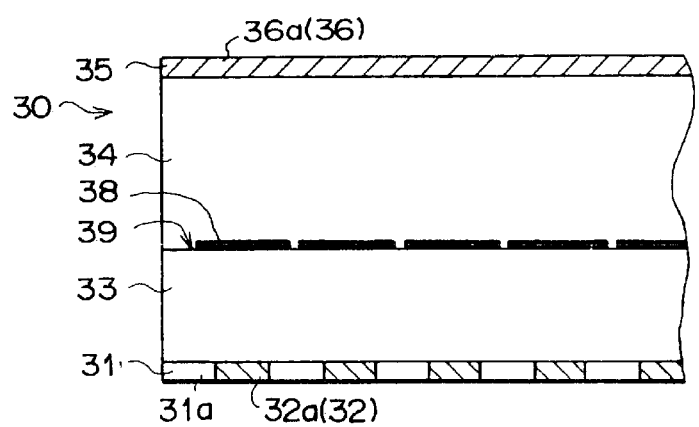
FIG. 19B is an X-Y sectional drawing of the portion shown by the arrow-P.
Figure 19C:
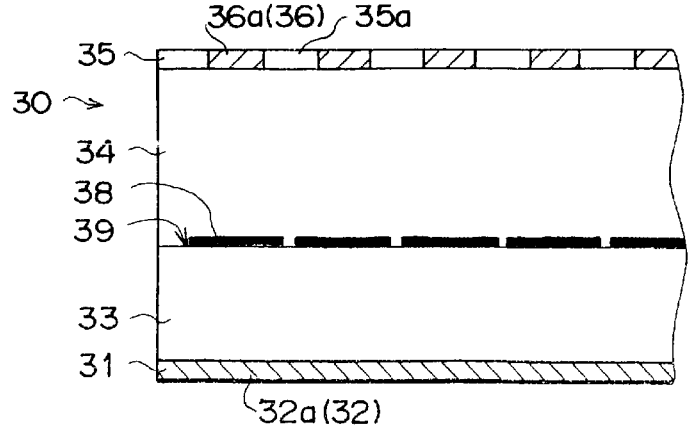
FIG. 19C is an X-Z sectional drawing of the portion shown by the arrow-Q.

Next, the radiation solid-state detector according to a seventh embodiment of the present invention will be described. FIG. 19A to FIG. 19C are drawings illustrating the schematic configuration of a radiation solid-state detector according to a seventh embodiment of the present invention, FIG. 19A being a perspective side view, FIG. 19B being an X-Y sectional drawing of the portion shown by the arrow-P, and FIG. 19C being an X-Z sectional drawing of the portion shown by the arrow-Q.

With this detector 30, a first electrode layer 31 in which a first stripe electrode 32 is formed comprising a number of flat plate elements 32a are arranged in the form of stripes. A photoconductive layer for preexposure, 33, which exhibits a conductivity when irradiated with preexposure light, a photoconductive layer for recording, 34, which exhibits a conductivity when irradiated with the recording light L2 which has permeated the subject, and a second electrode layer 35 in which a second stripe electrode 36 comprising a number of flat plate elements 36a are arranged in the form of stripes is formed, are stacked together in this order (more specifically, refer to Japanese Patent Application No. 11 (1999)-87923 filed by the present applicant). Between the photoconductive layer for recording, 34, and the photoconductive layer for preexposure, 33, a charge storing section 39 for storing latent image charges is formed.

The elements 36a of the second stripe electrode 36 are disposed so that they almost orthogonally intersect the elements 32a of the first stripe electrode 32. The number of elements 36a or 32a provided is the same as the number of pixels along the direction of element arrangement. An area 35a between elements 36a, and an area 31a between elements 32a, is filled with an insulating material having permeability to the recording light or the preexposure light.

In the pixel locations which each correspond to the location where the element 36a intersects the element 32a, at the boundary between the photoconductive layer for recording, 34, and the photoconductive layer for preexposure, 33, which is the charge storing section 39, a number of square microplates 38 are discretely disposed, each being spaced apart from the adjacent microplates 38. The microplates 39 are disposed in the discrete state, i.e., the floating state in which they are not connected to one another.

The microplates 38 each have a dimension approximately equal to the smaller pixel size which can be resolved. In other words, the length of each side of the microplate 38 is approximately equal to the arrangement pitch for the elements 32a, 36a. This length is not always limited to that which is approximately equal to the arrangement pitch for the elements 32a, 36a, and it may be smaller than the arrangement pitch for the elements 32a, 36a. In any case, the smallest pixel size which can be resolved corresponds to this dimension of the microplate 38.

Figure 20:
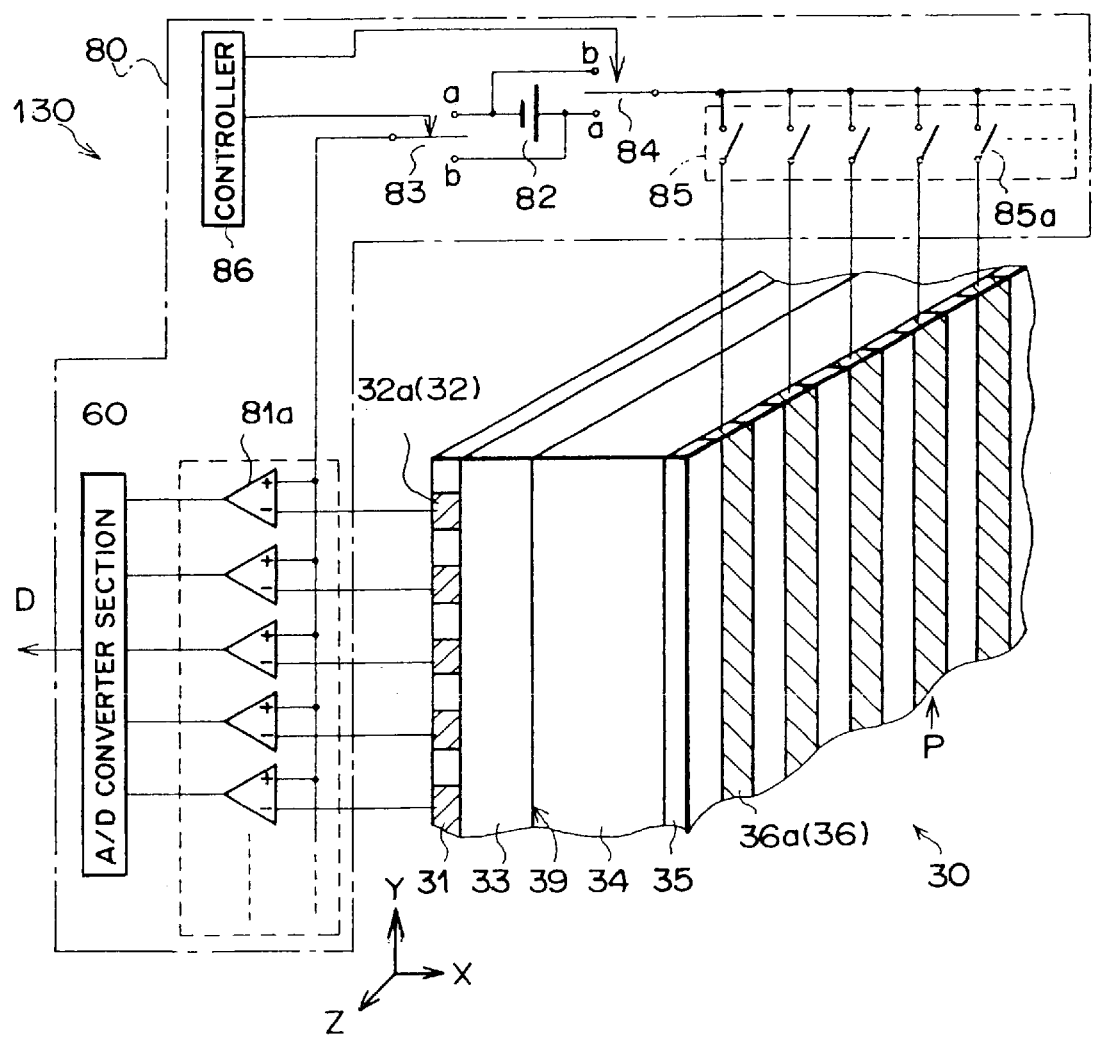
FIG. 20 is a schematic configuration diagram for a record-reading device using the solid-state radiation detector of the seventh embodiment, shown with a perspective side view of the detector.
Figure 21:
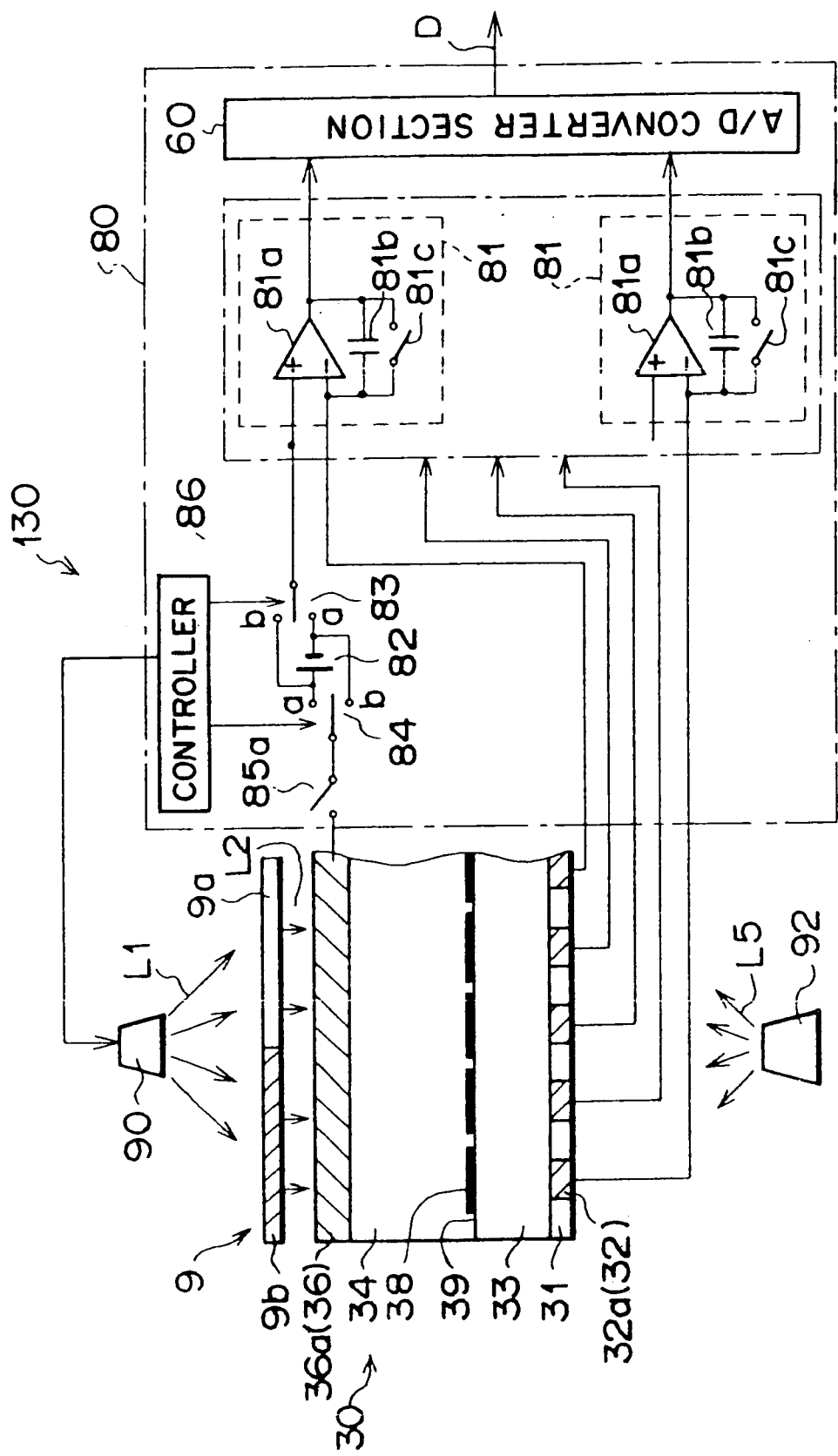
FIG. 21 is a schematic configuration diagram for a record-reading device using the solid-state radiation detector of the seventh embodiment, shown with an X-Y sectional drawing in the arrow-P portion of the detector.

FIG. 20 and FIG. 21 are diagrams illustrating the schematic configuration of a record-reading device 130 using the above-stated detector 30, FIG. 20 being a diagram shown with a perspective side view of the detector 30, and FIG. 21 being a diagram shown with an X-Y sectional drawing of the portion shown by the arrow-P of the detector 30.

This record-reading device 130 comprises the detector 30, and the reading section 80 as image data acquisition means for acquiring image data. In addition, it is provided with recording light projection means 90 for emitting radiation L1 and projecting the recording light L2 which has been penetrated through the subject onto the detector 30, and preexposure light projection means 94 for projecting preexposure light L5 to almost uniformly store the charges in the charge storing section 39.

The reading section 80 comprises a number of current detection amplifiers 81 for detecting the discharge current flowing out to the outside from the detector 30 for the charging current flowing into the detector 30, a power supply 82, switches 83 and 84, and the switch section 85. The reading section 80 is also provided with an A/D converter section 60 as with the above-stated reading section 50, and an image signal S, which is an output of the respective current detection amplifiers 81, is inputted to the A/D converter section 60.

The current detection amplifiers 81 each comprise an operational amplifier 81a, an integrating capacitor 81b, and a switch 81c, as with the above-stated current detection amplifier 51 and the like. The non-inverting input terminal (+) of each operational amplifier 81a is commonly connected to the output of the switch 83, and the inverting input terminal (−) is individually connected to the element 32a.

The positive electrode of the power supply 82 is connected to the input 83b of the switch 83, and the input 84a of the switch 84. The negative electrode of the power supply 82 is connected to the input 83a of the switch 83, and the input 84b of the switch 84.

The switch section 85 has a number of switching elements 85a which are individually connected to each of the elements 36a of the second stripe electrode 36. The switching element 85a preferably has a sufficiently high off-resistance, and for example, an MOS-FET is used. The other terminal of each switching element 85a of the switching section 85 is commonly connected to the output of the switch 84.

The reading section 80 is provided with controller means 86, and in projecting the recording light L2 onto the detector 30 after projecting the preexposure light L5, the controller means 86 disconnects at least one of the switches 83 and 84 from any of the terminals for disconnecting the detector 30 and the power supply 82 from each other to stop the application of the voltage to the detector 30.

When the preexposure light L5 is to be projected, the controller means 86 connects both of the switches 83 and 84 to the respective "a" or "b" terminals so that the voltage is applied to the detector 30 through the imaginary short circuit in the operational amplifiers 81a. The polarity of the voltage applied to the detector 30 when the switches 83 and 84 are both connected to the respective "a" terminals is opposite to that when they are both connected to the respective "b" terminals. After the preexposure light L5 has been projected, the connection of the switches 83 and 84 is switched over from the connection to the respective "a" terminals to that to the respective "b" terminals, for example, as required, so that the voltage having the polarity opposite to that when the preexposure light L5 was projected is applied to the detector 30. In other words, the power supply 82 and the switches 83 and 84 constitute preexposure voltage application means. The voltage of the power supply 82 must be such that the potential gradient in the photoconductive layer for preexposure, 33, is 1 V/$\mu$m to 10 V/$\mu$m.

Further, in reading, the controller means 86 sequentially selects the element 36a of the second stripe electrode 36 along the longitudinal direction of the element 32a, while connecting the selected element 36a to the elements 32a of the first stripe electrode 32 through the imaginary short circuit in the operational amplifiers 81a. This sequential selection along the longitudinal direction of the element 32a by the switch section 85 corresponds to the vertical scanning.

When reading, the switch 83 is connected to the terminal "a" with the switch 84 being connected to the terminal "b", or the switch 83 is connected to the terminal "b" with the switch 84 being connected to the terminal "a" so that when the imaginary short circuit in the operational amplifiers 81a is neglected, the elements 36a are each directly connected to the elements 32a in sequence. The current detection amplifiers 81 concurrently detect the discharge current flowing out from the detector 30 to the outside for the respective elements 36a of the second stripe electrode 36 on the selective connection by the switch section 85, acquiring an electric signal at the level corresponding to the quantity of the charges stored in the charge storing section 39.

On the other hand, the switch 83 may be connected to the terminal "a" with the switch 84 being connected to the terminal "a" so that the voltage having the same polarity and magnitude as those of the voltage which had been applied to the detector 30 just before the recording light L2 was projected is applied across each of the elements 36a and the elements 32a in sequence. The current detection amplifiers 81d concurrently detect the charging current flowing into the detector 30 for the respective elements 36a of the second stripe electrode 36 on the selective connection by the switch section 85, acquiring an electric signal at the level corresponding to the quantity of the charges stored in the charge storing section 39.

In other words, the switch section 85 constitutes connection means for connecting each of the elements 36a of the second stripe electrode 36 to the elements 32a of the first stripe electrode 32, and the switch section 85 and the power supply 82 constitute reading voltage application means for applying the specified voltage across each of the elements 36a of the second stripe electrode 36 and the elements 32a of the first stripe electrode 32.

Hereinbelow, the method for projecting preexposure light L5 onto the detector 30 to uniformly store the charges in the charge storing section 39 of the above-configured record-reading device 130, and thereafter, recording radiation image information as a static latent image, and further reading out the recorded static latent image will be described.

Figure 22A:
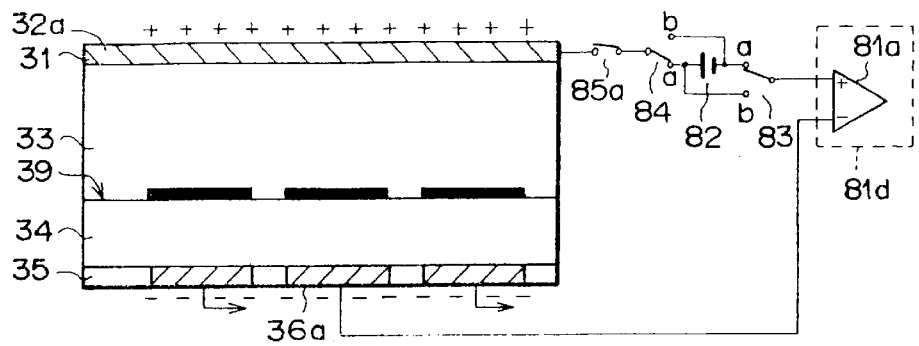
FIG. 22A to FIG. 22C show an electric charge model illustrating the charge uniform storing process in the case where the solid-state radiation detector according to the seventh embodiment is used.
Figure 22B:
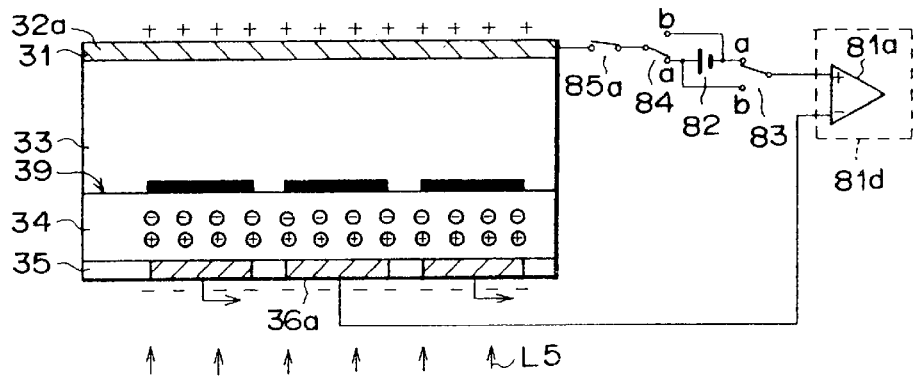

First, the charge uniform storing process in which the charges are uniformly stored in the charge storing section 39 will be described with reference to the electric charge model as shown in FIG. 22A to FIG. 22B. The negative charges (−) and the positive charges (+) generated in the photoconductor layer for preexposure, 33, by the preexposure light L5 are expressed by circling the signs "−" and "+" on the drawing.

In storing the charges uniformly in the charge storing section 39 of the detector 30, the switches 83 and 84 are both first turned to the respective "a" terminals. All the switching elements 85a in the switch section 85 are then turned on, and the DC voltage is applied across the first stripe electrode 32 and the second stripe electrode 36 from the power supply 82 through the operational amplifiers 81a to positively electrify all the elements 32a of the first stripe electrode 32 and negatively electrifying all the elements 36a of the second stripe electrode 36a (FIG. 22A). In this way, a concentrated electric field is generated across both electrodes around the locations where both elements 32a and 36a intersect each other.

Then, in the state in which the voltage is applied across both electrodes, the preexposure light L5 having a roughly uniform intensity is projected onto the entire surface of the electrode layer 35 from the second electrode layer 35 side. The preexposure light L5 permeates the electrode layer 35 of the detector 30, and generates pairs of charges, positive and negative, of the quantity corresponding to that of the preexposure light in the photoconductive layer for preexposure, 33 (FIG. 22B).

Figure 22C:
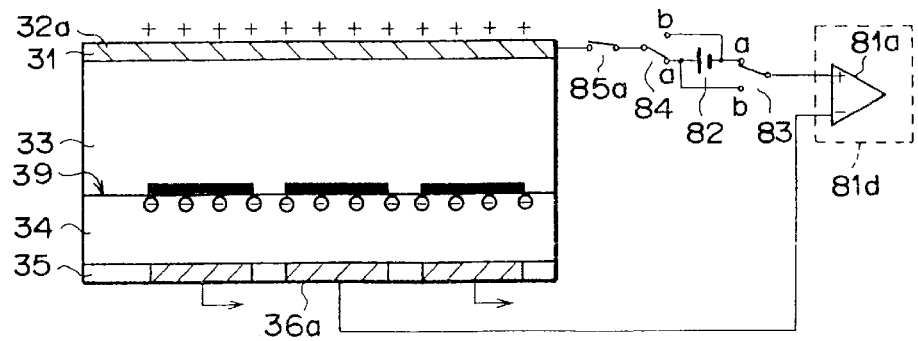
Figure 24A:
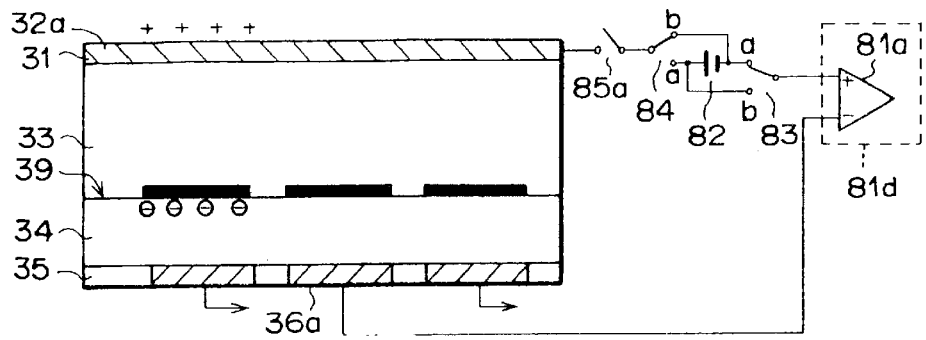
FIG. 24A to FIG. 24C show an electric charge model illustrating the latent image reading process on the discharge current detection in the case where the solid-state radiation detector according to the seventh embodiment is used.
Figure 24B:
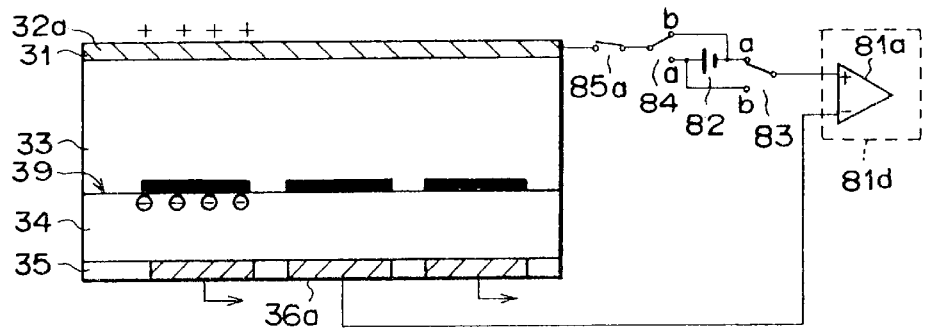
Figure 24C:
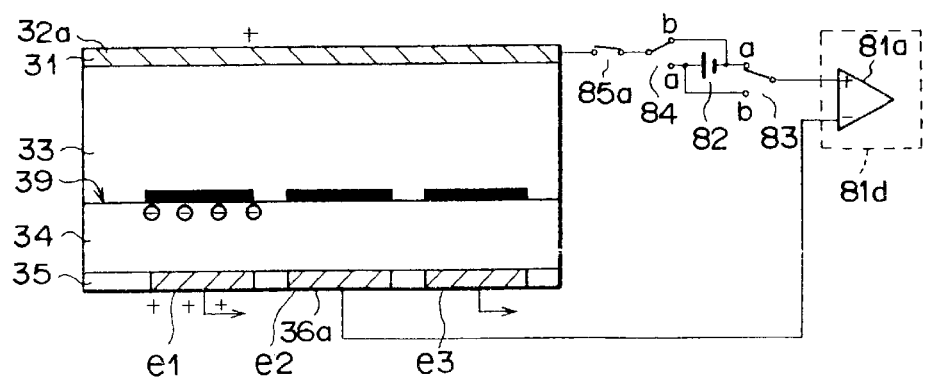

Across the first stripe electrode 32 and the second stripe electrode 36, a concentrated electric field is generated around the locations where both elements 32a and 36a intersect each other. Therefore, according to this electric field, the negative charges of the pairs of charges generated are transferred toward the charge storing section 39 side, being caught by the microplates 38. On the other hand, the positive charges are transferred toward the electrode layer 35 side, and cancelled by charge-recoupling with the negative charges stored on the elements 36a of the stripe electrode 36. If the preexposure light L5 is sufficiently projected, all the negative charges stored on the elements 36a are cancelled as a result of being charge-recoupled with the positive charges generated in the photoconductive layer for preexposure, 33. In other words, the situation at this time is the same as would be caused if the microplates 38 where short-circuited to the elements 36a, the negative charges being caught and stored on the microplates 38, and uniformly stored in the charge storing section 39 with the positive charges being stored on the elements 32a (FIG. 22C). In this way, a voltage having the same magnitude as that of the voltage applied by the power supply 82 is generated across the microplates 38 and the elements 32a.

Next, the static latent image recording process which records radiation image information as a static latent image will be described with reference to the electric charge model as shown in FIG. 23A to FIG. 23C. As with the charge uniformly storing process, the negative charges (−) and the positive charges (+) generated in the photoconductive layer for recording, 34, by the preexposure light L5 are expressed by encircling the signs "−" and "+" on the drawing.

When recording a static latent image in the detector 30, at least one of the switches 83 and 84 is disconnected from any of the terminals to disconnect the detector 30 and the power supply 82 from each other to stop the application of the voltage to the detector 30. Instead of operating the switches 83 and 84, all the switching elements 85a of the switch section 85 may be turned off (FIG. 23A).

The subject 9 is then irradiated with the radiation L1, and the recording light L2 carrying the radiation image information for the subject which has passed through the permeating portion 9a of the subject 9 is projected onto the first electrode layer 31 side of the detector 30. The recording light L2 permeates the first electrode layer 31 of the detector 30, and generates pairs of charges, positive and negative, of the quantity corresponding to the dose of the recording light L2 in the photoconductive layer for recording, 34 (FIG. 23B). Across the first stripe electrode 32 and the charge storing section 39, the specified electric field is generated between the positive electrodes stored on the elements 32a and the negative charges caught by the microplates 38 and uniformly stored on the microplates 38. Therefore, according to this electric field, the negative charges of the pairs of charges generated are transferred toward the first electrode layer 31 side, and cancelled by being charge-recoupled with the positive charges stored on the elements 32a of the strip electrode 32. The positive charges are transferred toward the charge storing section 39 side, and cancelled by being charge-recoupled with the negative charges stored on the microplates 38 (as shown in the right portion of FIG. 23C).

On the other hand, the radiation L1 which has been projected onto the shading portion 9b of the subject 9 will not permeate the subject 9, and so the elements 32a of the first stripe electrode 32 and the microplates 38 under the shading portion 9b will be left positively and negatively electrified, respectively (as shown in the left portion of FIG. 23C).

Incidentally, the above description has been given on the assumption that the quantity of the pairs of charges which is large enough to cancel all the charges stored on the elements 32a and the microplates 38 in the charge storing section 39 are generated in the photoconductive layer for recording, 34. However, the quantity of the pairs of charges which are actually generated depends upon the intensity and the dose of the recording light L2 projected onto the detector 30. The pairs of charges the quantity of which is large enough to cancel all the charges uniformly stored in the detector by the preexposure may not be generated.

The quantity of the charges which are left stored in the detector 30 is roughly in inverse proportion to the intensity ad the dose of the radiation for recording, i.e., the recording light L2 projected onto the detector 30. This means that, the quantity of the charges uniformly stored in the charge storing section 39 by the preexposure from which the quantity of the residual charges is subtracted is for carrying the static latent image. In other words, the negative charges carrying the static latent image are stored in the charge storing section 39 as the latent image charges for recording the static latent image in the detector 30.

In the preexposure process, the latent image charges (negative charges) are stored, being concentrated on the microplates 38. Therefore, the electric lines of force in the photoconductive layer for recording, 34, in recording are concentrated on the microplates 38, which means that the sharpeness in recording can be improved.

Next, the static latent image reading process which reads out the static latent image recorded in the detector will be described with reference to the electric charge model as shown in FIG. 24A to FIG. 24C and FIG. 25A to FIG. 25C. As with the charge uniformly storing process and the recording process, the negative charges (−) and the positive charges (+) generated in the photoconductive layer for recording, 34, by the preexposure light L5 are expressed by circling the signs "−" and "+" on the drawing.

First, the method for detecting the discharge current flowing out from the detector 30 to obtain an electric signal at the level corresponding to the quantity of the charges stored in the charge storing section 39, and thus, reading out the static latent image carrying the radiation image information from the detector 30, will be described.

In reading out the static latent image from the detector 30 by detecting the discharge current, the switch 83 is first connected to the terminal "a" with the switch 84 being connected to the terminal "b", or the switch 83 is connected to the terminal "b" with the switch 84 being connected to the terminal "a" so that, when the switching element 85a in the switch section 85 is turned on, the element 36a is directly connected to the elements 32a through the imaginary short circuit in the operational amplifiers 81a.

Then, the switching elements 85a in the switch section 85 are sequentially selected from one end to the other along the longitudinal direction of the element 32a to be turned on one by one so that the turned-on switching element 85a and the connected element 36a are connected to the elements 32a of the first stripe electrode 32 through the operational amplifiers 81a. By this selective connection, the elements 36a and the elements 32a are sequentially caused to have the same potential, and charge-rearrangement is carried out with respect to the negative charges stored on the microplates 38 in the portion corresponding to the connected element 36a. In other words, the positive charges stored on the connected element 36a are transferred toward the first electrode layer 31 side through the operational amplifiers 81a, and the positive charges are rearranged according to the magnitude of the capacitance $C_a$ across the microplates 38 in the corresponding portion and the element 36a, and the magnitude of the capacitance $C_b$ across the microplates 38 and the elements 32a. Contrarily, in the portion where no negative charges are stored on the microplates 38, no positive charges are transferred.

The current detection amplifiers 81 concurrently detects the discharge current $I_d$ flowing out from the detector 30 on this transfer of the positive charges for the elements 32a. In other words, the voltage at the output section of the current detection amplifiers 81 varies depending upon the discharge current $I_d$. This change in voltage corresponds to the quantity of the latent image charges for each pixel which had been stored in the detector 30. Therefore, by sequential switching of the switch section 85, the change in voltage is observed in sequence in correspondence with the latent image charges for each pixel, and by detecting this change in voltage, an image signal carrying the static latent image is obtained, i.e., radiation image information is read out.

Then, as with the function of the above-stated A/D converter section 60, the image signal S, which is an output from the current detection amplifiers 81, is inputted to the A/D converter section 60, and the image signal S detected discretely for each element 36a is digitized discretely for each element 36a.

Here, as stated above, according to the magnitude of the capacitance $C_a$ across the microplates 38 and the element 36a, and the magnitude of the capacitance $C_b$ across the microplates 38 and the elements 32a, the positive charges are redistributed. Because the current detection amplifier 81d detects the discharge current $I_d$ on the transfer of positive charges by converting it into a voltage, the magnitude of the discharge current $I_d$ which can be taken out by the current detection amplifier 81d as a voltage signal is in proportion to the value of $C_b/(C_a+C_b)$.

Next, the method for detecting the discharge current flowing into the detector 30 to obtain an electric signal at the level corresponding to the quantity of the charges stored in the charge storing section 39, and in this way, reading out the static latent image carrying the radiation image information from the detector 30, will be described.

In reading out the static latent image from the detector 30 by detecting the charging current, the switches 83 and 84 are first connected to the terminal "a" so that, when the switching element 85a in the switch section 85 is turned on, the voltage having the same polarity and magnitude as those of the voltage which had been applied to the detector 30 just before the recording light L2 was projected, i.e., the DC voltage from the power supply 82 is applied across the element 36a and the elements 32a through the imaginary short circuit in the operational amplifiers 81a.

Then, the switching elements 85a in the switch section 85 are sequentially selected from one end to the other end along the longitudinal direction of the element 32a to be turned on one by one so that the voltage from the power supply 82 is applied across the turned-on switching element 85a and the connected element 36a, and the elements 32a of the first stripe electrode 32.

With the elements 36a and the elements 32a which sandwich the portion where no negative charges are stored on the microplates 38, the application of the voltage to the detector 30 by this sequential switching causes the elements 36a to be positively electrified, and the elements 32a to be negatively electrified. On the other hand, in the portion where negative charges are stored on the microplates 38, the voltage having a magnitude that is the same as that of the applied voltage is developed across the microplates 38 and the elements 36a, so that new electrification will not be generated, and no charges being transferred.

As is the case where the discharge current is detected, which is stated above, the current detection amplifiers 81 concurrently detects the charging current flowing into the detector 30 on the transfer of the charges involved in storing them for the elements 32a, and by sequential switching of the switch section 85 to detect the change in voltage which is observed in sequence at the output section of the current detection amplifiers 81 in correspondence with the latent image charges for each pixel, an image signal carrying the static latent image is obtained, i.e., radiation image information is read out.

As stated above, the latent image charges are stored, being concentrated on the microplates 38, and the electric lines of force in the photoconductive layer for recording, 34, when recording are concentrated on the microplates 38, resulting in the sharpeness in recording being increased. This means the image signal having a high sharpeness can also be obtained when reading.

The voltage on the capacitance $C_a$ across the microplates 38 and the elements 36a in the portion where charges are stored on the microplates 38, and the voltage on the series capacitance of the capacitance $C_a$ across the microplates 38 and the elements 36a and the capacitance $C_b$ across the microplates 38 and the elements 32a in the portion where no charges are stored on the microplates 38 are both the same as the application voltage. Because the current detection amplifier 81d detects the charging current $I_c$ involved in electrification by converting it into a voltage, the magnitude of the charging current $I_c$ which can be taken out as a voltage signal is in proportion to the value of ($C_a$ in series with $C_b$)/$C_a$=$C_b/(C_a+C_b)$.

Up to now, the preferred embodiments of the radiation solid-state detector according to the present invention, and the method and device for recording of radiation image information in the detector, and the method and device for reading out the radiation image information from the detector according to the present invention in which the radiation image information is recorded have been described, but the detector according to the present invention is not limited to the above-stated embodiments. The basic detector to which the present invention is applicable may be of any type, provided that it is a detector which stacks the electrodes so that they sandwich the photoconductive layer for recording; and so long as the gist of the invention is not changed, the detector according to the present invention can be changed in various ways.

With the detectors according to the above-stated embodiments, one square microplate is provided for each pixel. However, the number of microplates may exceed one to some degree, so long as the microplates allow forming a pixel in the fixed location or causing the latent image charges to have the same potential so that the latent image charges around the pixel can be sufficiently discharged in the reading process, or the latent image charges can be concentrated on the pixel central portion in the recording process. For example, four triangular conductive members may be disposed for each pixel so that they form a square as a whole for allowing, in the recording process and the reading process, the latent image charges to be concentrated on the square central portion where the vertexes of the triangular members are collected, or sectorial conductive members may be disposed so that they form a circle as a whole.

With the above-stated detectors 10b, 10c, and 10d according to the second to fifth embodiments, the microplates 18 are provided in the detector in which the sub-electrode 17 is provided in the location close to the charge transporting layer 13 in the photoconductive layer for recording, 12. However, the microplates 18 may be provided in the detector in which the sub-electrodes 17 is provided in some other layer in the detector.

Further, the above-stated detector 30 according to the seventh embodiment is a detector having a photoconductor layer for preexposure which exhibits a conductivity when irradiated with preexposure light, and having the microplates 38 in the charge storing section 39, which is the boundary between the photoconductive layer for recording, 34, and the photoconductive layer for preexposure, 33. However, it may be a detector with which the photoconductive layer for preexposure, 33, of the detector 30 is replaced with an dielectric layer which will not exhibit conductivity if irradiated with preexposure light, and the microplates 18 are provided in the charge storing section 39, which is the boundary between the photoconductive layer for recording, 34, and the dielectric layer. In this case, the process for uniformly storing the charges in the charge storing section 38, 39 before projecting the recording light onto the detector is different, but the method for reading out the static latent image from the detector to acquire the image data carrying the radiation image information is the same as that when the above-stated detector 30 is used (more specifically, refer to Japanese Patent Application No. 11 (1999)-87923 filed by the same present applicant).

Further, with any of the detectors according to the above-stated embodiments, the photoconductive layer for recording exhibits a conductivity when irradiated with the radiation for recording, but, the photoconductive layer for recording according to the present invention is not always limited to this, and the photoconductive layer for recording may be such that it exhibits a conductivity when irradiated with the light emitted by excitation on the radiation for recording (more specifically, refer to Japanese Patent Application No. 10 (1998)-232824). In this case, on the surface of the first electrode layer there must be stacked a wavelength conversion layer, a so called X-ray scintillator, which wavelength-converts the radiation for recording into light in the other wavelength region, such as blue light. As this wavelength conversion layer, it is preferable to use such a substance as cesium iodide (CsI). The first electrode layer must be permeable to the light emitted in the wavelength conversion layer by excitation on the radiation for recording.

With the detectors 10, 10a, 10b, 10c, etc., a charge transporting layer is provided between the photoconductive layer for recording and the photoconductive layer for reading, and at the boundary between the photoconductive layer for recording and the charge transporting layer, a charge storing section is formed. However, with the present invention, the charge transporting layer may be replaced with a trap layer.

What is claimed is:

1. A radiation solid-state detector comprising:

a first electrode layer;

a photoconductive layer for recording, which exhibits a conductivity when irradiated with radiation which has been projected or when irradiated with light emitted for excitation of said photoconductive layer;

a second electrode layer, in this order; and a charge storing section for storing a plurality of charges of quantity corresponding to a dose of said radiation or for storing a quantity of said light as a plurality of latent image charges being formed in a vicinity of a surface of said photoconductive layer for recording, and for storing a radiation image information recorded in said charge storing section as a static latent image;

wherein a conductive member for causing said latent image charges to have the same potential is discretely provided in said charge storing section for each pixel for said static latent image, and is put in an electrically non-connected state.

2. A radiation solid-state detector according to claim 1, wherein a size of said conductive member is set at a value approximately equal to a pitch of said pixel.

3. A radiation solid-state detector according to claim 1, wherein a size of said conductive member is set at a value less than half of a pitch of said pixel, and said conductive member is disposed in roughly a central portion of said pixel.

4. A radiation solid-state detector according to any one of the claims 1 to 3, wherein said electrode of said first and/or second electrode layer is a stripe electrode, and said conductive member is disposed so that said conductive member corresponds to the pixel locations which are defined by the strip electrode.

5. A radiation solid-state detector according to claim 4, wherein a charge transporting layer which acts roughly as an insulator for said latent image charges, and acts roughly as a conductor for charges opposite in polarity to said latent image charges is provided, and said charge transporting layer forms said charge storing section.

6. A radiation solid-state detector according to claim 5, wherein said photoconductive layer comprises a photoconductive layer for reading, and said charge transporting layer is located between said photoconductive layer for recording and said photoconductive layer for reading; and said conductive member is located at the boundary between said photoconductive layer for recording and said charge storing section.

7. A radiation solid-state detector according to claim 4, wherein a trap layer for catching said latent image charges is provided, and said trap layer forms said charge storing section.

8. A radiation solid-state detector according to claim 7, wherein said conductive member is located at the boundary between said photoconductive layer for recording and said trap layer.

9. A radiation solid-state detector according to any one of the claims 1 to 3, wherein a charge transporting layer which acts roughly as an insulator for said latent image charges, and acts roughly as a conductor for charges opposite in polarity to said latent image charges is provided, and said charge transporting layer forms said charge storing section.

10. A radiation solid-state detector according to claim 9, wherein said photoconductive layer comprises a photoconductive layer for reading, and said charge transporting layer is located between said photoconductive layer for recording and said photoconductive layer for reading; and said conductive member is located at the boundary between said photoconductive layer for recording and said charge storing section.

11. A radiation solid-state detector according to any one of the claims 1 to 3, wherein a trap layer for catching said latent image charges is provided, and said trap layer forms said charge storing section.

12. A radiation solid-state detector according to claim 11, wherein said conductive member is located at the boundary between said photoconductive layer for recording and said trap layer.

13. A radiation solid-state detector according to claim 1, wherein said conductive member is formed as a two-dimensional array of conductors in a first and second direction.

14. A radiation solid-state detector comprising:

a first electrode layer;

a photoconductive layer for recording, which exhibits a conductivity when irradiated with radiation which has been projected or when irradiated with light emitted for excitation of said photoconductive layer;

a second electrode layer, in this order; and a charge storing section for storing a plurality of charges of quantity corresponding to a dose of said radiation or for storing a quantity of said light as a plurality of latent image charges being formed in a vicinity of a surface of said photoconductive layer for recording, and for storing a radiation image information recorded in said charge storing section as a static latent image;

a two dimensional conductive member that is discretely provided for each pixel, is located in said charge storing section, is put in an electrically non-connected state, and causes a plurality of charges surrounding a respective pixel to concentrate on a central portion of said pixel, thereby causing said latent image charges to have the same potential; and an opposing conductive member disposed opposite said two-dimensional conductive member.

15. The radiation detector according to claim 14, wherein said opposing conductive member comprises a plurality of stripe electrodes.

16. The radiation detector according to claim 15, wherein said plurality of stripe electrodes have a narrower dimension than a pixel, each of said stripe electrodes being centered relative to a respective pixel.

* * * * *